(12) United States Patent
Watanabe et al.

(10) Patent No.: US 10,689,556 B2
(45) Date of Patent: Jun. 23, 2020

(54) THERMALLY CONDUCTIVE SHEET

(71) Applicants: POLYMATECH JAPAN CO., LTD., Saitama (JP); PANASONIC INTELLECTUAL PROPERTY MANAGEMENT CO., LTD., Osaka (JP)

(72) Inventors: Yasuyoshi Watanabe, Saitama (JP); Yoshiya Sakaguchi, Kyoto (JP); Masafumi Nakayama, Hokkaido (JP)

(73) Assignees: Sekisui Polymatch Co., Ltd., Saitama (JP); Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/575,464

(22) PCT Filed: May 20, 2016

(86) PCT No.: PCT/JP2016/065080
§ 371 (c)(1),
(2) Date: Nov. 20, 2017

(87) PCT Pub. No.: WO2016/190258
PCT Pub. Date: Dec. 1, 2016

(65) Prior Publication Data
US 2018/0163112 A1      Jun. 14, 2018

(30) Foreign Application Priority Data
May 28, 2015   (JP) .................................. 2015-108953

(51) Int. Cl.
*B32B 9/00*      (2006.01)
*C09K 5/14*      (2006.01)
(Continued)

(52) U.S. Cl.
CPC .................. *C09K 5/14* (2013.01); *B32B 7/02* (2013.01); *B32B 27/08* (2013.01); *B32B 27/20* (2013.01);
(Continued)

(58) Field of Classification Search
CPC ......... C01B 31/04; B32B 9/00; Y10T 428/30; B82Y 30/00
(Continued)

(56) References Cited

U.S. PATENT DOCUMENTS

2002/0197923 A1   12/2002   Tobita et al.
2003/0129352 A1   7/2003    Takahashi
(Continued)

FOREIGN PATENT DOCUMENTS

JP   2001-315244 A   11/2001
JP   2002-363421 A   12/2002
(Continued)

OTHER PUBLICATIONS

International Search Report for PCT Patent App. No. PCT/JP2016/065080 (dated Aug. 9, 2016) with English language translation thereof.
(Continued)

*Primary Examiner* — Daniel H Miller
(74) *Attorney, Agent, or Firm* — Cermak Nakajima & McGowan LLP; Tomoko Nakajima

(57) ABSTRACT

Provided is a thermally conductive sheet including an oriented-graphite thermally conductive layer and an insulating thermally conductive layer stacked on the oriented-graphite thermally conductive layer, the oriented-graphite thermally conductive layer including a polymer matrix including a plate-like graphite powder, flat surfaces of particles of the plate-like graphite powder being oriented in the thickness direction of the sheet, the insulating thermally conductive
(Continued)

layer including a polymer matrix including an insulating thermally conductive filler dispersed in the polymer matrix, the insulating thermally conductive layer having a thermal conductivity and an insulating property. The thermally conductive sheet has a high thermal conductivity and an insulating property, is capable of being readily fixed to an adherend, and is easy to handle.

6 Claims, 2 Drawing Sheets

(51) Int. Cl.
| | |
|---|---|
| C08L 83/04 | (2006.01) |
| C08K 3/013 | (2018.01) |
| H01L 23/373 | (2006.01) |
| H01L 23/42 | (2006.01) |
| C08K 3/04 | (2006.01) |
| B32B 7/02 | (2019.01) |
| B32B 27/08 | (2006.01) |
| B32B 27/20 | (2006.01) |
| B32B 27/28 | (2006.01) |
| C08K 7/00 | (2006.01) |
| C08G 77/20 | (2006.01) |
| C08K 7/02 | (2006.01) |
| C08G 77/12 | (2006.01) |
| B82Y 30/00 | (2011.01) |

(52) U.S. Cl.
CPC ............ *B32B 27/281* (2013.01); *C08K 3/013* (2018.01); *C08K 3/04* (2013.01); *C08K 3/042* (2017.05); *C08K 7/00* (2013.01); *C08L 83/04* (2013.01); *H01L 23/373* (2013.01); *H01L 23/3737* (2013.01); *H01L 23/42* (2013.01); *B32B 2307/302* (2013.01); *B32B 2307/536* (2013.01); *B82Y 30/00* (2013.01); *C08G 77/12* (2013.01); *C08G 77/20* (2013.01); *C08K 7/02* (2013.01); *C08K 2201/001* (2013.01); *C08K 2201/005* (2013.01); *Y10T 428/30* (2015.01)

(58) Field of Classification Search
USPC ............... 428/408; 252/501; 423/447.1, 448; 165/185
See application file for complete search history.

(56) References Cited

U.S. PATENT DOCUMENTS

| | | | |
|---|---|---|---|
| 2005/0022966 | A1 | 2/2005 | Takahashi |
| 2005/0101719 | A1 | 5/2005 | Ishihara |
| 2007/0160751 | A1* | 7/2007 | Fischer ................. C04B 41/009 |
| | | | 427/189 |
| 2007/0284366 | A1 | 12/2007 | Ohta |
| 2010/0073882 | A1 | 3/2010 | Yoshikawa et al. |
| 2011/0272119 | A1* | 11/2011 | Bhagwagar ............ C08L 83/04 |
| | | | 165/104.11 |
| 2018/0292148 | A1 | 10/2018 | Watanabe |

FOREIGN PATENT DOCUMENTS

| | | |
|---|---|---|
| JP | 2003-198166 A | 7/2003 |
| JP | 2004-087735 A | 3/2004 |
| JP | 2005-56837 A | 3/2005 |
| JP | 2005-146057 A | 6/2005 |
| JP | 2007-326976 A | 12/2007 |
| JP | 2011-082423 A | 4/2011 |
| JP | 2011-165792 A | 8/2011 |
| JP | 2012-038763 A | 2/2012 |
| JP | 2013-199103 A | 10/2013 |
| WO | WO2008/053843 A1 | 5/2008 |

OTHER PUBLICATIONS

International Search Report for PCT Patent App. No. PCT/JP2016/067674 (dated Aug. 23, 2016) with English language translation thereof.

Written Opinion for PCT Patent App. No. PCT/JP2016/067674 (dated Aug. 23, 2016).

* cited by examiner

THERMALLY CONDUCTIVE SHEET

This application is a national phase entry under 35 U.S.C. § 371 of PCT Patent Application No. PCT/JP2016/065080, filed on May 20, 2016, which claims priority under 35 U.S.C. § 119 to Japanese Patent Application No. 2015-108953, filed May 28, 2015, both of which are incorporated by reference.

TECHNICAL FIELD

The present invention relates to a thermally conductive sheet that can be used while interposed between a heating element and a radiator.

BACKGROUND ART

Electronic devices, such as computers and automotive components, include radiators, such as a heat sink, with which heat generated in a heating element, such as a semiconductor element or a mechanical component, is dissipated. A thermally conductive sheet may be interposed between the heating element and the radiator in order to increase the efficiency with which the heat is transferred to the radiator. An example of the thermally conductive sheet is disclosed in Japanese Unexamined Patent Application Publication No. 2012-038763 (PTL 1), which is a thermally conductive sheet filled with scaly graphite particles oriented in a specific direction which serve as thermally conductive materials.

It has not been possible to use the thermally conductive sheets including the oriented graphite particles in applications that require an insulating property although such thermally conductive sheets have a high thermal conductivity in the thickness direction, because graphite is electrically conductive. In order to address the above issues, WO2008/053843 (PTL 2) discloses a thermally conductive sheet formed by stacking an insulating resin film on a surface of a thermally conductive sheet filled with scaly graphite particles orientated in a specific direction which serve as thermally conductive materials.

CITATION LIST

Patent Literature

PTL 1: Japanese Unexamined Patent Application Publication No. 2012-038763
PTL 2: WO2008/053843

SUMMARY OF INVENTION

Technical Problem

It has been difficult to use the thermally conductive sheet formed by stacking an insulating resin film on a surface of a thermally conductive sheet filled with the oriented scaly graphite particles in application that require a high thermal conductivity, because such a thermally conductive sheet has a significantly lower thermal conductivity than thermally conductive sheets that do not include the resin film. Furthermore, because the surface of the insulating resin film is hard, it has been difficult to fix the thermally conductive sheet to an adherend, that is, the thermally conductive sheet has been difficult to handle.

The present invention was made in light of the above issues. It is an object of the present invention to provide a thermally conductive sheet having a high thermal conductivity in addition to an insulating property. It is another object of the present invention to provide a thermally conductive sheet that is easy to handle.

Solution to Problem

In order to achieve the above-described objects, a thermally conductive sheet according to the present invention has the following structure.

Specifically, the present invention provides a thermally conductive sheet including an oriented-graphite thermally conductive layer and an insulating thermally conductive layer stacked thereon, the oriented-graphite thermally conductive layer including a polymer matrix including a plate-like graphite powder, flat surfaces of particles of the plate-like graphite powder being oriented in the thickness direction of the sheet, the insulating thermally conductive layer including a polymer matrix including an insulating thermally conductive filler dispersed in the polymer matrix, the insulating thermally conductive layer having a thermal conductivity and an insulating property.

The thermally conductive sheet according to the present invention includes an oriented-graphite thermally conductive layer including a polymer matrix including a plate-like graphite powder, the flat surfaces of particles of the plate-like graphite powder being oriented in the thickness direction. This increases the thermal conductivity of the sheet in the thickness direction and allows heat to be transferred also in the lateral direction of the sheet. Specifically, a comparison is made between the thermally conductive sheet including the plate-like graphite powder and a thermally conductive sheet including graphitized carbon fibers oriented in a specific direction. The thermally conductive sheet including graphitized carbon fibers has a high thermal conductivity in the thickness direction of the sheet, which is the axial direction of the carbon fibers, but the axial direction of the carbon fibers is only one. In contrast, the thermally conductive sheet including the plate-like graphite powder is thermally conductive in the planar direction of particles of the plate-like graphite powder, that is, in not only one direction but the planar direction of the sheet.

In addition, particles of the plate-like graphite powder come into contact with one another with high probability, since the surfaces of particles of the plate-like graphite powder are superimposed on one another. This increases the thermal conductivity of the sheet in the planar direction, promotes heat transfer among the graphite powder particles, and thereby increases the thermal conductivity of the sheet in the direction in which particles of the plate-like graphite powder are oriented.

Furthermore, the normal directions of the surfaces of particles of the plate-like graphite powder are randomly inclined to the thickness direction of the sheet. This makes particles of the plate-like graphite powder to be resistant to being bent when the sheet is compressed and enables a consistent thermal conductivity to be achieved.

The thermally conductive sheet according to the present invention includes an insulating thermally conductive layer including a polymer matrix including an insulating thermally conductive filler dispersed in the polymer matrix, the insulating thermally conductive layer having a thermal conductivity and an insulating property. This enables an insulating property to be imparted to the thermally conductive sheet without significantly reducing the thermal conductivity of the thermally conductive sheet compared with a thermally conductive sheet that includes only the oriented-graphite thermally conductive layer. Consequently, the thermally conductive sheet according to the present invention can be suitably used in applications that requires an insulating property.

The polymer matrix may be produced by curing a liquid silicone prepared using a base agent and a curing agent.

When the thermally conductive sheet includes a polymer matrix produced by curing a liquid silicone prepared using a base agent and a curing agent, it becomes possible to reduce, to a low level, the viscosity of a polymer composition that is to be cured to form the polymer matrix. This facilitates charging of the plate-like graphite powder and the thermally conductive filler. As a result, the degree of orientation of the thermally conductive sheet may be increased.

The oriented-graphite thermally conductive layer may have a Type-OO hardness of 10 to 80 as determined in accordance with ASTM D2240. The insulating thermally conductive layer may be harder than the oriented-graphite thermally conductive layer and have a Type-E hardness of 70 or less as determined in accordance with ASTM D2240 and a thickness of 0.15 to 1.5 mm.

Limiting the Type-OO hardness of the oriented-graphite thermally conductive layer to be 10 to 80 as determined in accordance with ASTM D2240 enhances the compressibility of the oriented-graphite thermally conductive layer and enables the thermally conductive sheet to come into close contact with an adherend. This reduces the heat resistance of the thermally conductive sheet to a low level and increases the thermal conductivity of the thermally conductive sheet. When the insulating thermally conductive layer is harder than the oriented-graphite thermally conductive layer, the insulating thermally conductive layer is likely to maintain an insulating property without becoming excessively compressed when the sheet is compressed. When the Type-E hardness of the insulating thermally conductive layer is 70 or less as determined in accordance with ASTM D2240, the thermally conductive sheet is capable of coming into close contact with an adherend and this reduces the likelihood of the thermal conductivity of the thermally conductive sheet being reduced due to the degradation in the adhesion, which may occur when the insulating thermally conductive layer is excessively hard. Limiting the thickness of the insulating thermally conductive layer to be 0.15 to 1.5 mm reduces the formation of pin holes, which is likely to occur when the insulating thermally conductive layer has an excessively small thickness. In addition, the inhibition of heat transfer, which is likely to occur when the insulating thermally conductive layer has an excessively large thickness, may also be reduced.

The Type-E hardness of the insulating thermally conductive layer may be 20 or more.

When the Type-E hardness of the insulating thermally conductive layer is 20 or more, the insulating thermally conductive layer does not become excessively crushed even when the sheet is compressed, that is, the insulating property of the thermally conductive sheet becomes stabilized. Since the upper limit of the Type-E hardness of the insulating thermally conductive layer is 70 or less, it is also possible to maintain the flexibility of the thermally conductive sheet with which the thermally conductive sheet is capable of coming into close contact with an adherend and reduce the heat resistance of the thermally conductive sheet.

The thermal conductivity of the oriented-graphite thermally conductive layer in the thickness direction may be 7 W/m·K or more and 30 W/m·K or less. The thermal conductivity of the insulating thermally conductive layer may be 2 W/m·K or more and less than 7 W/m·K.

Limiting the thermal conductivity of the oriented-graphite thermally conductive layer to be 7 W/m·K or more and 30 W/m·K or less and the thermal conductivity of the insulating thermally conductive layer to be 2 W/m·K or more and less than 7 W/m·K enables the thermal conductivity of the thermally conductive sheet to be closer to that of the oriented-graphite thermally conductive layer. Consequently, the reduction in the thermal conductivity of the thermally conductive sheet which occurs when the insulating thermally conductive layer is added to the thermally conductive sheet can be limited to a low level.

The thermal conductivity of the insulating thermally conductive layer is preferably 5 W/m·K or more.

When the thermal conductivity of the insulating thermally conductive layer is 5 W/m·K or more, it becomes possible to limit the reduction in the thermal conductivity of the thermally conductive sheet and to maintain the thermal conductivity of the thermally conductive sheet at a high level even when the thickness of the insulating thermally conductive layer is increased to about 1.5 mm.

In the thermally conductive sheet, the thermal conductivity (W) (unit: W/m·K) and the thickness (T) (unit: mm) of the insulating thermally conductive layer may satisfy the relationship represented by Formula (1).

$$0 < T \leq 0.21W - 0.26 \qquad \text{Formula (1)}$$

When the thermal conductivity (W) (unit: W/m·K) and thickness (T) (unit: mm) of the insulating thermally conductive layer satisfy the relationship represented by Formula (1) above, the thermally conductive sheet has a high thermal conductivity.

The insulating thermally conductive layer may have a smaller thickness than the oriented-graphite thermally conductive layer.

When the insulating thermally conductive layer has a smaller thickness, the reduction in the thermal conductivity of the thermally conductive sheet may be limited. In addition, it becomes possible to compress the oriented-graphite thermally conductive layer, which has a larger thickness, with certainty and thereby reduce the heat resistance of the oriented-graphite thermally conductive layer.

The oriented-graphite thermally conductive layer may include particles of a thermally conductive filler which have an aspect ratio of 2 or less.

Adding particles of a thermally conductive filler which have an aspect ratio of 2 or less to the oriented-graphite thermally conductive layer enables both particles of the plate-like graphite powder and the particles of a thermally conductive filler other than the plate-like graphite powder to be charged into the oriented-graphite thermally conductive layer in large amounts compared with the case where only the plate-like graphite powder is charged into the oriented-graphite thermally conductive layer alone. This increases the thermal conductivity of the thermally conductive sheet.

Advantageous Effects of Invention

The thermally conductive sheet according to the present invention has a high thermal conductivity and an insulating property. The thermally conductive sheet according to the present invention can be readily fixed to an adherend and is easy to handle.

DESCRIPTION OF EMBODIMENTS

Figure 1:
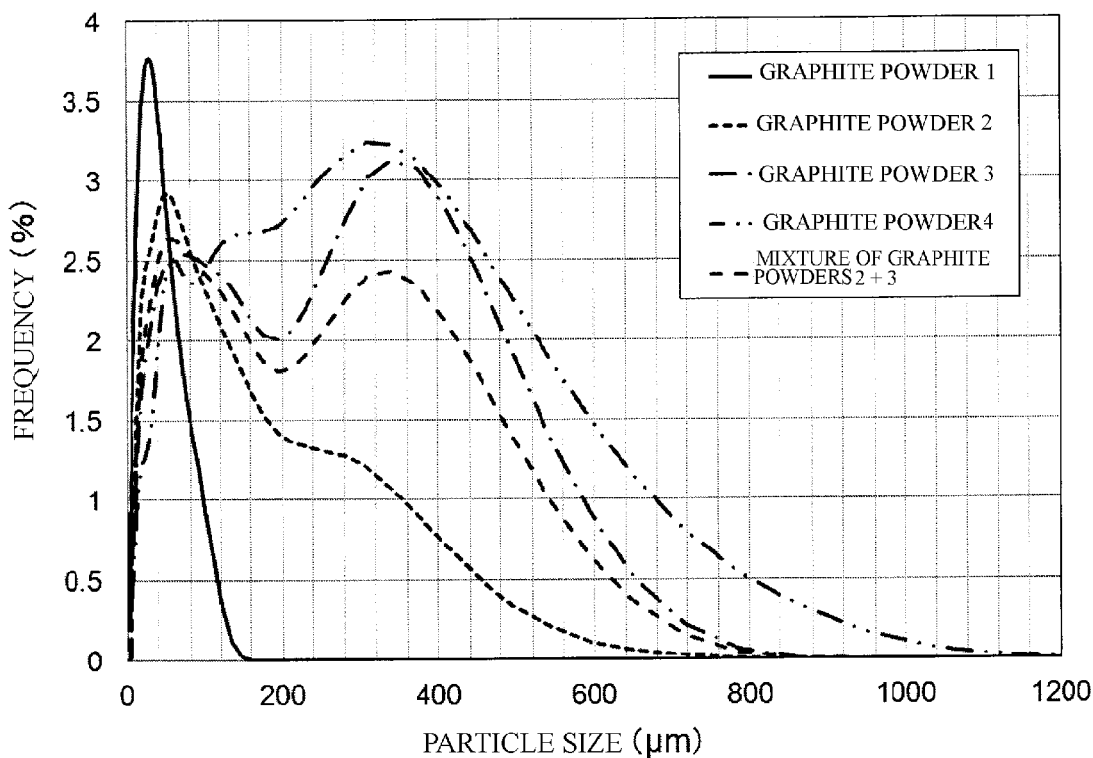
FIG. 1 includes graphs illustrating the particle size distributions of plate-like graphite powders with respect to surface area frequency.

The present invention is described more in detail on the basis of the embodiments below. In the following embodiments, duplicate descriptions of the same components, the same compositions, the same production methods, the same actions, the same effects, and the like are omitted.

First Embodiment

A thermally conductive sheet according to the first embodiment includes an oriented-graphite thermally conductive layer having a sheet-like shape and an insulating thermally conductive layer stacked thereon.

<Oriented-Graphite Thermally Conductive Layer>

The oriented-graphite thermally conductive layer is a layer formed by mixing a liquid polymer composition, which is a material for a polymer matrix, with a plate-like graphite powder and a thermally conductive filler other than the plate-like graphite powder and curing and forming the resulting mixed composition into a sheet-like shape. In the polymer matrix, the flat surfaces of particles of the plate-like graphite powder are oriented in the thickness direction of the sheet. The expression "particles of the plate-like graphite powder are oriented in the thickness direction" used herein specifically refers to the flat surfaces of more than 50% of the particles of the plate-like graphite powder being inclined at an angle of less than 30° with respect to the thickness direction of the sheet.

The oriented-graphite thermally conductive layer preferably has a Type-OO durometer hardness (hereinafter, referred to as "OO-hardness") of 10 to 80 as determined in accordance with ASTM D2240 used in American Society for Testing and Materials.

If the OO-hardness of the oriented-graphite thermally conductive layer exceeds 80, the compressibility of the oriented-graphite thermally conductive layer at the point of use may become degraded and, consequently, the insulating thermally conductive layer stacked on the oriented-graphite thermally conductive layer may become excessively compressed and crushed into a thickness smaller than intended. In addition, the deformation of the insulating thermally conductive layer may result in cracking or the like, which degrades the insulating property of the thermally conductive sheet. Although the degradation of the insulating property of the thermally conductive sheet may be limited by increasing the hardness of the insulating thermally conductive layer, increasing the hardness of the insulating thermally conductive layer also results in an increase in the hardness of the entire thermally conductive sheet. In such a case, the capability of the thermally conductive sheet to follow the variation in the shape of a heating element or a radiator may become degraded. Consequently, the adhesion between the thermally conductive sheet and the heating element or radiator may be reduced, which leads to the degradation of the thermal conductivity of the thermally conductive sheet. In contrast, when the OO-hardness of the oriented-graphite thermally conductive layer is 80 or less, the likelihood of the insulating thermally conductive layer becoming excessively compressed is small and the thermally conductive sheet is capable of suitably following the variation in the shape of a heating element or a radiator. As a result, the sufficient adhesion between the thermally conductive sheet and the heating element or radiator can be maintained.

On the other hand, if the OO-hardness of the oriented-graphite thermally conductive layer is less than 10, it becomes difficult to maintain the shape of the oriented-graphite thermally conductive layer. In such a case, the orientation of the graphite particles may become degraded when the sheet is compressed and, consequently, the thermal conductivity of the thermally conductive sheet may be reduced. In contrast, when the OO-hardness of the oriented-graphite thermally conductive layer is 10 or more, it becomes easy to maintain the shape of the oriented-graphite thermally conductive layer, which leads to an increase in ease of handling of the thermally conductive sheet.

In order to control the hardness of the oriented-graphite thermally conductive layer to fall within the above preferable range, a polymer matrix having a hardness lower than the desired hardness of the oriented-graphite thermally conductive layer is selected. This is because the hardness of the oriented-graphite thermally conductive layer can be increased by increasing the amount of plate-like graphite powder or thermally conductive filler charged into the oriented-graphite thermally conductive layer.

The thickness of the oriented-graphite thermally conductive layer is preferably 0.25 to 10 mm. If the thickness of the oriented-graphite thermally conductive layer is less than 0.25 mm, when particles of the plate-like graphite powder are oriented in a specific direction inside a metal mold, a space sufficient for the rotation of particles of the plate-like graphite powder may fail to be kept in the metal mold and the rotation of particles of the plate-like graphite powder may be inhibited. On the other hand, if the thickness of the oriented-graphite thermally conductive layer exceeds 10 mm, the heat resistance of the oriented-graphite thermally conductive layer may be increased disadvantageously.

The thermal conductivity of the oriented-graphite thermally conductive layer in the thickness direction, that is, in the direction in which particles of the plate-like graphite powder are oriented, may be 7 W/m·K or more and 30 W/m·K or less. The higher the thermal conductivity of the oriented-graphite thermally conductive layer, the larger the advantageous effects. However, the larger the difference in thermal conductivity between the oriented-graphite thermally conductive layer and the insulating thermally conductive layer, the higher the difficulty to increase the thermal conductivity of the thermally conductive sheet. Accordingly, if the thermal conductivity of the oriented-graphite thermally conductive layer exceeds 30 W/m·K, the difference in thermal conductivity between the oriented-graphite thermally conductive layer and the insulating thermally conductive layer becomes excessively large and it becomes impossible to significantly change the thermal conductivity of the thermally conductive sheet by increasing the thermal conductivity of the oriented-graphite thermally conductive layer. The thermal conductivity of the oriented-graphite thermally conductive layer can be determined by the method used in Test examples below. Note that, the term "thermal conductivity" used herein refers to a thermal conductivity in the thickness direction of the sheet (i.e., the direction in which particles of the plate-like graphite powder are oriented) unless otherwise specified.

The oriented-graphite thermally conductive layer is electrically conductive since it includes the oriented particles of the plate-like graphite powder. As a measure of the electrical conductivity of the oriented-graphite thermally conductive layer, the volume resistivity of the oriented-graphite thermally conductive layer is preferably 500 to 10000 Ω·cm. This is because there is a certain correlation between electrical conductivity and thermal conductivity and an oriented-graphite thermally conductive layer having an electrical conductivity of 500 to 10000 Ω·cm has a high thermal conductivity. The volume resistivity of the oriented-graphite thermally conductive layer can be determined by interposing the oriented-graphite thermally conductive layer between metal sheets plated with gold, compressing the oriented-graphite thermally conductive layer to a thickness 10% the initial thickness thereof, and measuring the resistance of the compressed oriented-graphite thermally conductive layer with a tester. The dielectric breakdown voltage of the oriented-graphite thermally conductive layer, which is described below, is 0 kV/mm.

The components of the oriented-graphite thermally conductive layer are described below.

Polymer Matrix:

The polymer matrix is composed of a polymer, such as a resin or a rubber, and is preferably formed by curing a liquid polymer composition that is a mixture of a base agent and a curing agent. Thus, examples of the polymer composition may include a polymer composition that contains a non-crosslinked rubber and a crosslinking agent; and a polymer composition constituted by a non-crosslinked rubber including a crosslinking agent and by a crosslinking promoter. The curing reaction of the polymer composition may be conducted by cold setting or thermosetting. When the polymer matrix is composed of a silicone rubber, for example, alkenyl-group-containing organopolysiloxane and organohydrogenpolysiloxane may be used. When the polymer matrix is composed of a thermoplastic polyester elastomer, for example, a diol and a dicarboxylic acid may be used. When the polymer matrix is composed of a thermoplastic polyurethane elastomer, a diisocyanate and a diol may be used. Among the above polymer compositions (uncured polymer matrices), an addition-reaction-type silicone rubber is preferably used because, when cured, it forms a markedly flexible polymer matrix into which the thermally conductive filler can be readily charged.

Plate-Like Graphite Powder:

The plate-like graphite powder included in the polymer matrix contains graphite powder particles having a plate-like shape, such as a scaly shape or a flat shape. Since the planes of graphite crystals extend in the planar direction of particles of the plate-like graphite powder, particles of the plate-like graphite powder have a markedly high thermal conductivity isotropically in the plane. Therefore, aligning the directions of the planes in a predetermined direction increases the thermal conductivity of the oriented-graphite thermally conductive layer in the specific direction.

Examples of the graphite used above include natural graphite and artificial graphite. It is preferable to use a plate-like graphite powder produced by pulverizing an artificial graphite sheet (hereinafter, referred to as "film-pyrolysis sheet") prepared by the pyrolysis of a polymer film. This is because the film-pyrolysis sheet has a high thermal conductivity particularly in the planar direction of the sheet and a plate-like graphite powder produced by pulverizing the film-pyrolysis sheet accordingly has a markedly high thermal conductivity.

The film-pyrolysis sheet can be formed by firing a polymer film at a high temperature of 2400° C. to 3000° C. in an inert gas. The firing treatment may be performed in one stage or in two or more stages. Although the type of the inert gas is not limited, it is suitable to use nitrogen or argon as an inert gas.

Although the type of the polymer film that is to be graphitized is not limited, it is preferable to use an aromatic polymer, such as polyimide, in order to form a graphite film having a well-developed graphite structure and a high thermal conductivity. The thickness of the polymer film may be selected appropriately in accordance with the desired thickness of particles of the plate-like graphite powder, is preferably 400 μm or less, and is more preferably 10 to 200 μm. Note that, particles of the plate-like graphite powder may have a smaller thickness than the polymer film, because peeling may occur between graphite layers in the pulverization of the graphite.

The method for pulverizing the film-pyrolysis sheet is not limited. For example, ball milling, a method in which a Nanomizer is used, jet milling, and pin milling may be used for pulverizing the film-pyrolysis sheet. It is preferable to form the film-pyrolysis sheet into relatively large particles of a plate-like graphite powder by a method in which a shear force is applied to the film-pyrolysis sheet with a blade. In the case where natural graphite is used, graphite particles having a certain aspect ratio are formed into a plate-like shape. As a plate-like graphite powder, only one type of plate-like graphite powder produced by the same method may be used alone, or plural types of plate-like graphite powders produced by different methods or from different sources may be used in a mixture. It is also possible to mix plural types of plate-like graphite powders having different particle size distributions.

Particles of the plate-like graphite powder preferably has an aspect ratio of more than 2. If the aspect ratio of particles of the plate-like graphite powder is 2 or less, it becomes difficult to align particles of the plate-like graphite powder in a specific direction and to increase the thermal conductivity of the oriented-graphite thermally conductive layer. The aspect ratio of particles of the plate-like graphite powder is more preferably 5 or more. The term "aspect ratio" used herein refers to the ratio of the length of the longer axis of the flat surfaces of particles of the plate-like graphite powder to the thickness of particles of the plate-like graphite powder.

The specific surface area of particles of the plate-like graphite powder is preferably 0.70 to 1.50 m$^2$/g and is more preferably 0.85 to 1.50 m$^2$/g. The specific surface area of particles is closely related to the size of the particles. If the specific surface area of particles of the plate-like graphite powder is less than 0.70 m$^2$/g, the proportion of the amount of particles of a plate-like graphite powder having a large size is relatively high. In such a case, the orientation of particles of the plate-like graphite powder may become degraded. In addition, the proportion of the amount of particles of a plate-like graphite powder having a large size of 800 μm or more is increased. In such a case, the viscosity of the mixed composition is likely to increase. In other words, it becomes difficult to charge particles of a plate-like graphite powder having a large size into the oriented-graphite thermally conductive layer in a large amount in the case where the viscosity of the mixed composition is adjusted to a desired viscosity.

It is commonly considered that, the larger the particles of the plate-like graphite powder, the lower the difficulty to increase the thermal conductivity of the oriented-graphite thermally conductive layer. However, in reality, it is difficult to increase the thermal conductivity of the oriented-graphite thermally conductive layer using particles of a plate-like graphite powder having a large size in consideration of the amount of plate-like graphite powder which can be charged in the oriented-graphite thermally conductive layer and the orientation of particles of the plate-like graphite powder. On the other hand, if the specific surface area of particles of the plate-like graphite powder exceeds 1.50 $m^2/g$, the proportion of the amount of fine powder is increased and, consequently, the viscosity of the mixed composition is also likely to increase. In such a case, it becomes difficult to charge particles of the plate-like graphite powder into the oriented-graphite thermally conductive layer in a large amount and to increase the thermal conductivity of the oriented-graphite thermally conductive layer. The specific surface area of particles of the plate-like graphite powder is more preferably 0.85 to 1.50 $m^2/g$, because this makes it possible to increase the amount of plate-like graphite powder that can be charged in the oriented-graphite thermally conductive layer, enhances the orientation of particles of the plate-like graphite powder, and consequently increases the thermal conductivity of the oriented-graphite thermally conductive layer. The specific surface area of particles of the plate-like graphite powder can be determined by a BET multi-point method.

The qualities of the plate-like graphite powder can be determined using the particle size distribution of the powder with respect to surface area frequency. The particle size distribution with respect to surface area frequency is a particle size distribution prepared by subjecting particles to a laser diffraction-scattering particle size distribution analyzer by a dry process and performing statistical analysis of particle size on an area basis.

In order to increase the amount of plate-like graphite powder that can be charged in the polymer matrix and the thermal conductivity of the oriented-graphite thermally conductive layer, it is preferable that a peak of the particle size distribution of the plate-like graphite powder occur at 20 to 400 μm and the ratio P2/P1 between the maximal surface area frequency P1 at 20 to 150 μm and the maximal surface area frequency P2 at 200 to 400 μm be 0.2 to 2.0. When the ratio P2/P1 is 0.2 to 2.0, the ratio between the amounts of two plate-like graphite powders having fairly different particle sizes, that is, 20 to 150 μm and 200 to 400 μm, falls within a predetermined range and the polymer matrix includes a plate-like graphite powder having a particle size of 20 to 150 μm and a plate-like graphite powder having a particle size of 200 to 400 μm in predetermined amounts.

If the above ratio is less than 0.2, that is, the proportion of the amount of plate-like graphite powder having a particle size of 20 to 150 μm is large, the amount of fine powder particles is increased, which makes it difficult to charge a large amount of plate-like graphite powder into the polymer matrix and to increase the thermal conductivity of the oriented-graphite thermally conductive layer. On the other hand, if the above ratio exceeds 2.0, the relative proportion of the plate-like graphite powder having a large particle size is increased, which also makes it difficult to charge a large amount of plate-like graphite powder into the polymer matrix and to increase the thermal conductivity of the oriented-graphite thermally conductive layer.

The proportion of plate-like graphite powder having a particle size of 800 μm or more determined from the particle size distribution of the powder with respect to surface area frequency is preferably 0.1% or less. This is because a plate-like graphite powder having a particle size of 800 μm or more is highly likely to degrade the orientation of particles of the plate-like graphite powder and, if the surface area frequency of such a plate-like graphite powder exceeds 0.1%, the likelihood of the thermal conductivity of the oriented-graphite thermally conductive layer becoming degraded due to the degradation of the orientation of particles of the plate-like graphite powder may be increased.

The amount of plate-like graphite powder included in the polymer matrix is preferably 75 to 105 parts by mass relative to 100 parts by mass of the polymer matrix. If the proportion of the amount of plate-like graphite powder is less than 75 parts by mass, it becomes difficult to increase the thermal conductivity of the oriented-graphite thermally conductive layer. If the proportion of the amount of plate-like graphite powder exceeds 105 parts by mass, the viscosity of the mixed composition is increased, which may result in the degradation of the orientation of particles of the plate-like graphite powder.

Thermally Conductive Filler:

The oriented-graphite thermally conductive layer preferably includes a thermally conductive filler in addition to the plate-like graphite powder. The thermally conductive filler is a material that imparts a thermal conductivity to the polymer matrix together with the plate-like graphite powder. It is particularly preferable that the oriented-graphite thermally conductive layer include particles of a thermally conductive filler having an aspect ratio of 2 or less.

When the particles of the plate-like graphite powder are oriented in the thickness direction of the sheet and the oriented-graphite thermally conductive layer preferably includes the thermally conductive filler other than the plate-like graphite powder or more preferably includes particles of the thermally conductive filler having a small aspect ratio, particles of the thermally conductive filler can be present in gaps between the surfaces of the oriented particles of the plate-like graphite powder in a suitable manner. This increases the thermal conductivity of the oriented-graphite thermally conductive layer.

Examples of particles of the thermally conductive filler include particles of a powder of a metal, a metal oxide, a metal nitride, a metal carbide, or a metal hydroxide having a spherical or indefinite shape; and spherical graphite particles. Examples of the metal include aluminum, copper, and nickel. Examples of the metal oxide include aluminum oxide, magnesium oxide, zinc oxide, and quartz. Examples of the metal nitride include boron nitride and aluminum nitride. Examples of the metal carbide include silicon carbide. Examples of the metal hydroxide include aluminum hydroxide. Among the above thermally conductive fillers, aluminum oxide and aluminum are preferable because they have a high thermal conductivity and are easily available in the form of spherical particles, and aluminum hydroxide are preferable because it is easily available and capable of enhancing the flame retardancy of the thermally conductive sheet.

Particles of the thermally conductive filler preferably have an aspect ratio of 2 or less. If the aspect ratio of particles of the thermally conductive filler exceeds 2, the viscosity of the mixed composition is likely to increase and it becomes difficult to charge a large amount of thermally conductive filler into the polymer matrix. For the above reasons, particles of the thermally conductive filler are preferably spherical.

The average particle size of the thermally conductive filler is preferably 0.5 to 35 μm. If the average particle size of the thermally conductive filler exceeds 35 μm, the particle size of the thermally conductive filler becomes close to the particle size of the plate-like graphite powder. In such a case, the orientation of particles of the plate-like graphite powder may become degraded. If the average particle size of the thermally conductive filler is less than 0.5 µm, the specific surface area of particles of the thermally conductive filler is large. In such a case, the viscosity of the mixed composition is likely to increase and it becomes difficult to charge a large amount of thermally conductive filler into the polymer matrix. However, when the capability of the polymer matrix to be filled with the thermally conductive filler does not become degraded by using a thermally conductive filler having an average particle size of less than 0.5 µm, such a thermally conductive filler may be added to the polymer matrix. The average particle size of the thermally conductive filler can be determined as volume-average particle size on the basis of the particle size distribution of the filler prepared by a laser diffraction-scattering method (JIS R1629).

The amount of thermally conductive filler added to the polymer matrix is preferably 250 to 700 parts by mass and is more preferably 350 to 600 parts by mass relative to 100 parts by mass of the polymer matrix. If the amount of thermally conductive filler is less than 250 parts by mass, a sufficient amount of particles of the thermally conductive filler fail to be present in the gaps between the plate-like graphite particles and, consequently, the thermal conductivity of the oriented-graphite thermally conductive layer may become degraded. If the amount of thermally conductive filler exceeds 700 parts by mass, the thermal conductivity of the oriented-graphite thermally conductive layer may stop increasing and, conversely, the heat conduction action of the plate-like graphite powder may become degraded. When the amount of thermally conductive filler is 350 to 600 parts by mass, the thermal conductivity of the oriented-graphite thermally conductive layer is high and the mixed composition has a suitable viscosity.

Additive:

Various additives may be added to the oriented-graphite thermally conductive layer such that the functions of the thermally conductive sheet are not impaired. For example, organic components such as a plasticizer, a dispersing agent, a coupling agent, and an adhesive may be added to the oriented-graphite thermally conductive layer. In addition, a flame retardant, an antioxidant, a colorant, and the like may also be added to the oriented-graphite thermally conductive layer as needed.

When the oriented-graphite thermally conductive layer includes the thermally conductive filler in addition to the plate-like graphite powder, a flexible sheet containing a relatively small amount of graphite which has a highly tacky surface can be produced. Accordingly, when the sheet is pressurized while interposed between a heating element and a radiator, a large compressive stress does not occur in the sheet and the likelihood of the substrate becoming distorted or excessively pressurized is small. Exposing the surface of the oriented-graphite thermally conductive layer at the surface of the thermally conductive sheet makes it easy to fix the thermally conductive sheet to a heating element or a radiator and increases the workability of the thermally conductive sheet. Since the oriented-graphite thermally conductive layer has tackiness, the oriented-graphite thermally conductive layer can be readily integrated with the insulating thermally conductive layer without using an adhesive layer in the case where the insulating thermally conductive layer is stacked on the oriented-graphite thermally conductive layer. This saves the costs of forming an adhesive layer and eliminates the risk of the thermal conductivity of the sheet being reduced by the adhesive layer.

<Insulating Thermally Conductive Layer>

The insulating thermally conductive layer is a sheet-like layer formed by curing a mixed composition containing a liquid polymer composition, which is a material for a polymer matrix, and an insulating thermally conductive filler. The insulating thermally conductive layer has an insulating property and imparts an insulating property to the thermally conductive sheet, which includes the oriented-graphite thermally conductive layer and the insulating thermally conductive layer stacked thereon.

Since the insulating thermally conductive layer imparts an insulating property to the thermally conductive sheet, the insulating thermally conductive layer preferably has a certain dielectric breakdown voltage. The dielectric breakdown voltage is a voltage at which the amount of current that passes through an electrically insulative specimen interposed between two electrodes suddenly starts increasing and the specimen becomes electrically conductive as a result of a portion of the specimen becoming molten to form a hole or carbonized when the voltage applied between the electrodes is gradually increased. More specifically, the dielectric breakdown voltage of the insulating thermally conductive layer determined with a withstanding voltage tester (TOS8650, produced by KIKUSUI ELECTRONICS CORPORATION) in accordance with JIS K6249 is preferably 3 kV/mm or more and is more preferably 5 kV/mm or more.

It is preferable that the insulating thermally conductive layer, which includes a polymer matrix including the insulating thermally conductive filler, have a higher hardness than the oriented-graphite thermally conductive layer and a Type-E hardness specified by ASTM D2240 (hereinafter, referred to as "E-hardness") of 70 or less and 20 or more.

If the insulating thermally conductive layer has a lower hardness than the oriented-graphite thermally conductive layer, the insulating thermally conductive layer may become excessively compressed and the insulating property of the insulating thermally conductive layer may become degraded at the point of use. If the E-hardness of the insulating thermally conductive layer exceeds 70, the adhesion between the thermally conductive sheet and an adherend may be reduced as a result of the increase in the hardness of the sheet and, consequently, the heat resistance of the thermally conductive sheet may be increased disadvantageously.

When the E-hardness of the insulating thermally conductive layer is 20 or more, the insulating thermally conductive layer has a suitable strength and is capable of maintaining a consistent insulating property even when the sheet is compressed. Furthermore, such an insulating thermally conductive layer also has flexibility with which the insulating thermally conductive layer can follow an adherend. This reduces the heat resistance of the sheet.

The thickness of the insulating thermally conductive layer is preferably 0.15 to 1.5 mm and is more preferably 0.25 to 1.5 mm. If the thickness of the insulating thermally conductive layer is less than 0.15 mm, pin holes may be formed. Furthermore, the insulating property of the insulating thermally conductive layer may become degraded as a result of the excessive reduction in the thickness of the insulating thermally conductive layer. If the thickness of the insulating thermally conductive layer exceeds 1.5 mm, the impacts of the insulating thermally conductive layer on the inhibition of heat conduction may be increased. When the thickness of the insulating thermally conductive layer is 0.25 mm or more, the insulating thermally conductive layer has a high dielectric breakdown voltage and a consistent insulating property.

The thermal conductivity of the insulating thermally conductive layer is preferably 2 W/m·K or more and less than 7 W/m·K and is more preferably 5 W/m·K or more and less than 7 W/m·K. If the thermal conductivity of the insulating thermally conductive layer is less than 2 W/m·K, the thermal conductivity of the thermally conductive sheet may be significantly reduced disadvantageously. If the thermal conductivity of the insulating thermally conductive layer is 7 W/m·K or more, the content of the insulating thermally conductive filler in the insulating thermally conductive layer is high. In such a case, the insulating thermally conductive layer becomes brittle and the insulating property of the insulating thermally conductive layer may become degraded when the insulating thermally conductive layer becomes compressed or deformed. Setting the thermal conductivity of the insulating thermally conductive layer to be 5 W/m·K or more and less than 7 W/m·K limits the reduction in the thermal conductivity of the thermally conductive sheet.

The term "thermal conductivity of the insulating thermally conductive layer" used herein refers to the thermal conductivity of the insulating thermally conductive layer in the thickness direction unless otherwise specified. It is possible to increase the thermal conductivity of the insulating thermally conductive layer in the thickness direction by aligning the longer axes of particles of the insulating thermally conductive filler having shape anisotropy, such as boron nitride particles, in the thickness direction. In contrast, when the insulating thermally conductive layer includes particles of an insulating thermally conductive filler which do not have shape anisotropy, such as spherical particles, the insulating thermally conductive layer has an isotropic thermal conductivity.

The thermal conductivity (W) (unit: W/m·K) and the thickness (T) (unit: mm) of the insulating thermally conductive layer preferably satisfy the relationship represented by Formula (1).

$$0 < T \leq 0.21W - 0.26 \qquad \text{Formula (1)}$$

When the above relationship is satisfied, the thermally conductive sheet has a high thermal conductivity.

Among the components of the insulating thermally conductive layer, the polymer matrix and additives may be the same as those described in Oriented-Graphite Thermally Conductive Layer above. Among the polymer matrices described as examples above, the same polymer matrix as used for forming the oriented-graphite thermally conductive layer may be used also for forming the insulating thermally conductive layer. In such a case, the oriented-graphite thermally conductive layer and the insulating thermally conductive layer have the same chemical structure, and the adhesion therebetween may be increased in the thermally conductive sheet. Moreover, the oriented-graphite thermally conductive layer and the insulating thermally conductive layer can be produced using the same material, which facilitates the production control.

Alternatively, a polymer matrix composed of a material different from the material for the polymer matrix included in the oriented-graphite thermally conductive layer may be used for forming the insulating thermally conductive layer. For example, using silicone for forming a layer that comes into contact with a radiator and using a non-silicone material for forming a layer that comes into contact with an electronic device, such as a substrate, reduce the bleed out of silicone toward the substrate and evaporation of low-molecular siloxane. In another case, it is possible to select a material for the oriented-graphite thermally conductive layer or the insulating thermally conductive layer which is compatible to an adherend to which the oriented-graphite thermally conductive layer or the insulating thermally conductive layer comes into contact. For example, a polymer matrix composed of a material that readily comes into close contact with an adherend may be selected in accordance with the material for the adherend.

In the insulating thermally conductive layer, the insulating thermally conductive filler serves as a material that imparts a thermal conductivity to the polymer matrix. The thermally conductive fillers described in Oriented-Graphite Thermally Conductive Layer above which are insulative may be added also to the insulating thermally conductive layer.

Among such insulating thermally conductive fillers, aluminum oxide particles are preferable because they have a high thermal conductivity and are spherical, and aluminum hydroxide particles are preferable in order to enhance the flame retardancy of the thermally conductive sheet. Spherical particles of an insulating thermally conductive filler are less likely to increase the viscosity of the mixed composition and capable of being readily charged into the polymer matrix in a large amount. It is preferable to use aluminum oxide and aluminum hydroxide from the viewpoint of ease of availability.

The average particle size of the insulating thermally conductive filler is preferably 0.5 to 50 µm. If the average particle size exceeds 50 µm, the formability of the insulating thermally conductive layer may become significantly degraded. If the average particle size of the insulating thermally conductive filler is less than 0.5 µm, the specific surface area of the particles of the insulating thermally conductive filler is accordingly increased. In such a case, the viscosity of the mixed composition is likely to increase and it becomes difficult to charge the insulating thermally conductive filler into the polymer matrix in a large amount. However, the mixed composition may contain a thermally conductive filler having an average particle size of less than 0.5 µm when the capability of the polymer matrix being filled with the thermally conductive filler is not degraded.

The amount of insulating thermally conductive filler added to the polymer matrix is preferably 300 to 2000 parts by mass and is more preferably 500 to 2000 parts by mass relative to 100 parts by mass of the polymer matrix. If the amount of insulating thermally conductive filler added is less than 300 parts by mass, the thermal conductivity of the insulating thermally conductive layer may be reduced disadvantageously. If the amount of insulating thermally conductive filler added exceeds 2000 parts by mass, the thermal conductivity of the insulating thermally conductive layer is not markedly increased and, conversely, the formability of the insulating thermally conductive layer becomes degraded. In such a case, it becomes difficult to form a thin insulating thermally conductive layer. When the amount of insulating thermally conductive filler added is 500 to 1500 parts by mass, the insulating thermally conductive layer has a high thermal conductivity and the liquid composition, which is to be formed into the insulating thermally conductive layer when cured, has a suitable viscosity.

Since the insulating thermally conductive layer includes the insulating thermally conductive filler but not the plate-like graphite powder, the sheet has a thermal conductivity and a high insulating property. Consequently, the thermally conductive sheet has an insulating property. Since the insulating thermally conductive layer has a higher hardness than the oriented-graphite thermally conductive layer and a certain degree of flexibility, the insulating thermally conductive layer is more resistant to being crushed than the oriented-graphite thermally conductive layer and readily maintains an insulating property even when it is pressurized while being interposed between a heating element and a radiator. In addition, the insulating thermally conductive layer has high adhesion to an adherend.

<Thermally Conductive Sheet>

The thermally conductive sheet that includes the oriented-graphite thermally conductive layer and the insulating thermally conductive layer stacked thereon has the following properties.

The thermal conductivity of the thermally conductive sheet is about 3 to 30 W/m·K and is preferably 10 W/m·K or more. When the thermal conductivity of the thermally conductive sheet is 10 W/m·K or more, a certain thermal conductivity required by thermally conductive sheets can be achieved.

While the thermal conductivity of the oriented-graphite thermally conductive layer is preferably 7 W/m·K or more and 30 W/m·K or less and the thermal conductivity of the insulating thermally conductive layer is preferably 2 W/m·K or more and less than 7 W/m·K, the difference in thermal conductivity therebetween is preferably minimized. If the difference in thermal conductivity between the oriented-graphite thermally conductive layer and the insulating thermally conductive layer is excessively large, it becomes not possible to significantly change the thermal conductivity of the thermally conductive sheet by increasing the thermal conductivity of the oriented-graphite thermally conductive layer, because the larger the difference in thermal conductivity, the higher the difficulty to increase the thermal conductivity of the thermally conductive sheet. For the above reasons, the thermal conductivity of the oriented-graphite thermally conductive layer is preferably 5 times or less the thermal conductivity of the insulating thermally conductive layer.

The thermally conductive sheet has a certain insulating property in addition to the above-described thermal conductivity. Specifically, the thermally conductive sheet includes the insulating thermally conductive layer having a dielectric breakdown voltage of 5 kV/mm or more and accordingly has a dielectric breakdown voltage of 5 kV/mm or more.

The ratio between the thicknesses of the oriented-graphite thermally conductive layer and the insulating thermally conductive layer is such that the thickness of the insulating thermally conductive layer is 1 to 0.015 relative to 1 of the thickness of the oriented-graphite thermally conductive layer. If the thickness of the insulating thermally conductive layer is increased such that the ratio "Thickness of oriented-graphite thermally conductive layer":"Thickness of insulating thermally conductive layer" exceeds 1:1, the impacts of the insulating thermally conductive layer on the thermal conductivity of the thermally conductive sheet are increased and, consequently, the thermal conductivity of the thermally conductive sheet may be reduced. If the thickness of the insulating thermally conductive layer is reduced such that the above ratio is lower than 1:0.015, the insulating property of the thermally conductive sheet may be reduced. In another case, the heat resistance of the thermally conductive sheet may be excessively increased as a result of the increase in the thickness of the oriented-graphite thermally conductive layer.

<Method for Producing Thermally Conductive Sheet>

One of the methods for producing the thermally conductive sheet is to bond, to each other, an oriented-graphite thermally conductive layer and an insulating thermally conductive layer prepared separately.

A first example of the methods for producing the oriented-graphite thermally conductive layer is a magnetic-field-orientation method in which a mixed composition containing a liquid polymer composition, a plate-like graphite powder, and a thermally conductive filler is placed in a magnetic field in order to align particles of the plate-like graphite powder along the magnetic field and the polymer composition is subsequently cured to form an oriented-graphite thermally conductive layer.

The contents of components of the mixed composition containing the liquid polymer composition and particles of the plate-like graphite powder and the thermally conductive filler that are uniformly dispersed in the liquid polymer composition are preferably such that the amount of plate-like graphite powder is 75 to 105 parts by mass and the amount of thermally conductive filler is 250 to 700 parts by mass relative to 100 parts by mass of the polymer composition. The proportions of contents of the above components correspond approximately to plate-like graphite powder: 10% to 25% by volume and thermally conductive filler: 25% to 60% by volume relative to polymer composition: 30% to 50% by volume in terms of volume percentage. The mixed composition may optionally contain additives and the like.

The viscosity of the mixed composition is preferably 10 to 300 Pa·s in order to perform magnetic field orientation. If the viscosity of the mixed composition is less than 10 Pa·s, sedimentation of the plate-like graphite powder and the thermally conductive filler may occur. If the viscosity of the mixed composition exceeds 300 Pa·s, the flowability of the mixed composition is too low to allow particles of the plate-like graphite powder to be oriented in the magnetic field or it requires a large amount of time to align the particles of the plate-like graphite powder. However, the viscosity of the mixed composition may be reduced to less than 10 Pa·s by using a thermally conductive filler resistant to sedimentation or an additive such as an anti-settling agent in combination.

Examples of a line-of-magnetic-force source used for generating the lines of magnetic force in the magnetic-field-orientation method include a superconducting magnet, a permanent magnet, an electromagnet, and a coil. A superconducting magnet is preferable, because it generates a magnetic field having a high magnetic flux density. The magnetic flux density of a magnetic field generated by the line-of-magnetic-force source is preferably 1 to 30 tesla. If the magnetic flux density is less than 1 tesla, it becomes difficult to align particles of the plate-like graphite powder in a specific direction. It is difficult to achieve a magnetic flux density exceeding 30 tesla in practice.

The layer formed by the magnetic-field-orientation method may be directly used as an oriented-graphite thermally conductive layer or may be sliced or cut into a final shape. When the oriented-graphite thermally conductive layer is formed using a metal mold, an ultrathin skin layer composed of the polymer matrix may be formed on the surface of the sheet. This skin layer reduces the detachment of particles of the plate-like graphite powder and the thermally conductive filler.

A second example of the methods for producing the oriented-graphite thermally conductive layer is a multilayer-body-slice method in which a shear force is applied to the mixed composition to form thin tabular preparatory sheets, and the plural preparatory sheets are stacked on top of one another and then cured to form a multilayer block, which is subsequently cut into pieces.

In the multilayer-body-slice method, first, the liquid polymer composition is mixed with the plate-like graphite powder, the thermally conductive filler, and the various optional additives, and the resulting mixture is stirred to form a mixed composition in which the solid substances added to the liquid polymer composition are uniformly dispersed. The mixed composition preferably has a relatively high viscosity of 10 to 1,000 Pa·s such that a shear force can be applied to the mixed composition when the mixed composition is extended into a sheet-like shape.

While a shear force is applied to the mixed composition, the mixed composition is flatly extended into a sheet-like shape. Applying a shear force to the mixed composition enables particles of the plate-like graphite powder to be oriented in a direction parallel to the surface of the sheet. One of the methods for forming the mixed composition into a sheet is to apply the mixed composition to a base film by using a coating applicator, such as a bar coater or a doctor blade, by extrusion molding, by ejecting the mixed composition from a nozzle, or the like. The thickness of the above sheet is preferably about 50 to 250 µm. The preparatory sheets are formed in the above manner. The planar direction of the preparatory sheets is equal to the direction in which particles of the plate-like graphite powder are oriented.

The plural preparatory sheets are stacked on top of one another to form a multilayer body. Subsequently, the mixed composition is cured with curing means adequate for curing polymer compositions, such as ultraviolet irradiation or hot-pressing, in order to form a multilayer block. Finally, the multilayer block is cut in a direction orthogonal to the direction in which particles of the plate-like graphite powder are oriented. Hereby, a sheet-like oriented-graphite thermally conductive layer is produced.

A comparison is made between the first and second methods, that is, the magnetic-field-orientation method and the multilayer-body-slice method.

In the multilayer-body-slice method, it is difficult to form a flexible and thin oriented-graphite thermally conductive layer. For example, in the case where the OO-hardness of the oriented-graphite thermally conductive layer is about 50 or less, it is difficult to form a quality thin-film sheet even when the sharpness of the blade used is increased to a maximum level, because the pressing force resulting from slicing the multilayer block severely deforms the excessively flexible sheet. One of the methods for addressing the above issue is to slice the multilayer block after freezing the multilayer block. Although the freezing method may be effective for an acrylic gel and the like, the hardness of the multilayer block that is to be sliced is not increased by this method when the polymer matrix included in the sheet is composed of silicone, whose hardness does not vary significantly even when frozen at −40°. Although it is still possible to increase the hardness of such a sheet by cooling the sheet to a further low temperature (in practice, to about −60°), it is difficult to cool the sheet to a temperature lower than −40° in reality because, for example, it requires special equipment and the frictional heat generated when the multilayer block is sliced may inhibit the cooling of the multilayer block.

The thermally conductive sheet is commonly compressed about 10% to 40% at the point of use in order to increase the adhesion between the adherends and the thermally conductive sheet and to reduce the heat resistance of the thermally conductive sheet. When the thermally conductive sheet is flexible, the amount of stress required for compressing the thermally conductive sheet is small. This reduces the likelihood of a substrate, which is the adherend, becoming distorted by the stress. However, it is difficult to form a highly flexible thermally conductive sheet by the multilayer-body-slice method, in which the limitation is imposed on the hardness of the oriented-graphite thermally conductive layer.

In the multilayer-body-slice method, furthermore, an anisotropy may occur in the physical properties and thermal conductivity of the thermally conductive sheet in the planar direction. Moreover, the adherence of the surface of the thermally conductive sheet may become degraded. This makes it difficult to fix the thermally conductive sheet to an adherend and degrades the workability of the thermally conductive sheet. In addition, the multilayer-body-slice method requires a step in which the plural preparatory sheets are stacked on top of one another to form a multilayer block and a step in which the multilayer block is sliced into a sheet-like shape. This increases the production costs. Furthermore, when the thermally conductive sheet is interposed between a heating element and a radiator, a pressing force is applied in a direction in which the interfaces between the sheets fall and, as a result, detachment may occur at the interfaces or particles of the plate-like graphite powder may become detached from one another.

In contrast to the multilayer-body-slice method, in the magnetic-field-orientation method, the normal direction of the flat surfaces of particles of the plate-like graphite powder is parallel to the planar direction of the thermally conductive sheet. In addition, the flat surfaces of particles of the plate-like graphite powder are each oriented in random directions. In the multilayer-body-slice method, the normal direction of the flat surfaces of particles of the plate-like graphite powder is parallel to the planar direction of the thermally conductive sheet and the flat surfaces of particles of the plate-like graphite powder are parallel to one another. In other words, when particles of the plate-like graphite powder are oriented by in the magnetic-field-orientation method, the flat surfaces of the plate-like graphite particles may be or may not be superimposed on one another, which makes the flat surfaces of the plate-like graphite particles to be resistant to detaching from one another. Consequently, the sheet is capable of conducting heat isotropically in the planar direction. In addition, since the interfaces at which plural sheets are bonded to one another are not present, the detachment of the sheets at the interfaces does not occur. Moreover, while the oriented-graphite thermally conductive layer preferably has an adhesive surface in order to form a multilayer body together with the insulating thermally conductive layer, such an adhesive surface is readily formed by the magnetic-field-orientation method. For the above reasons, it is preferable to produce the oriented-graphite thermally conductive layer by the magnetic-field-orientation method.

It is possible to increase the thermal conductivity of the oriented-graphite thermally conductive layer in either case where the magnetic-field-orientation method or the multilayer-body-slice method is used, by slicing or cutting the oriented-graphite thermally conductive layer along a plane perpendicular to the orientation direction such that particles of the plate-like graphite powder and the thermally conductive filler are exposed at the cut surface and come into contact with an adherend with a large area.

A method for producing the insulating thermally conductive layer is described below.

The insulating thermally conductive layer is formed by preparing a mixed composition containing a liquid polymer composition and a thermally conductive filler and curing the polymer composition. The contents of components of the mixed composition are preferably such that the amount of thermally conductive filler is 300 to 2000 parts by mass relative to 100 parts by mass of the polymer composition. The proportion of the thermally conductive filler in the polymer composition corresponds approximately to 50% to 90% in terms of volume percentage. The mixed composition may optionally contain additives and the like.

Examples of the methods for forming the mixed composition into the insulating thermally conductive layer include bar coating, a doctor blade method, extrusion molding (e.g., a T-die method), calender forming, press forming, and casting. Accordingly, the viscosity of the mixed composition is preferably set to fall within a specific range in which the mixed composition can be formed into a thin film by the above methods.

It is possible to integrate the oriented-graphite thermally conductive layer and the insulating thermally conductive layer together only by stacking them on top of each other when at least one of the oriented-graphite thermally conductive layer and the insulating thermally conductive layer has adhesiveness resulting from the polymer matrix. In consideration of ease of integration of the oriented-graphite thermally conductive layer and the insulating thermally conductive layer, it is preferable that both oriented-graphite thermally conductive layer and insulating thermally conductive layer have adhesiveness. Since the oriented-graphite thermally conductive layer and the insulating thermally conductive layer have certain flexibility, in many cases, the surfaces thereof have adhesiveness sufficient to bond the layers to each other without using an adhesive. If the surfaces of the oriented-graphite thermally conductive layer and the insulating thermally conductive layer do not have such adhesiveness, an adhesive or the like may be interposed between the layers.

Another example of the method for producing the thermally conductive sheet is to form the oriented-graphite thermally conductive layer in a sheet-like shape, coat the oriented-graphite thermally conductive layer with the mixed composition, which is a material for the insulating thermally conductive layer, and cure the polymer composition. In this production method, the insulating thermally conductive layer is cured on the surface of the oriented-graphite thermally conductive layer and a step in which the two layers are integrated with each other can be omitted.

The above-described production methods are merely examples, and any publicly known production method other than the above-described methods may be employed.

Second Embodiment

A thermally conductive sheet according to the second embodiment is a sheet-like thermally conductive sheet that includes an oriented-graphite thermally conductive layer and two insulating thermally conductive layers stacked on the respective surfaces of the oriented-graphite thermally conductive layer. According to the second embodiment, the oriented-graphite thermally conductive layer including graphite particles, which are electrically conductive powder particles, is interposed between the insulating thermally conductive layers. This reduces the detachment of the graphite particles and the occurrence of a short circuit.

Third Embodiment

A thermally conductive sheet according to the third embodiment is a sheet-like thermally conductive sheet that includes an insulating thermally conductive layer and two oriented-graphite thermally conductive layers stacked on the respective surfaces of the insulating thermally conductive layer. While forming the insulating thermally conductive layer by the multilayer-body-slice method reduces the tackiness of the surface of the insulating thermally conductive layer, according to the third embodiment, it is possible to produce a thermally conductive sheet having such smooth surfaces.

The distinctive structures according to the above embodiments may be combined with one another such that the advantageous effects of the embodiments are not impaired. For example, a pair of the thermally conductive sheets according to the first embodiment may be stacked on top of each other.

Examples

The present invention is further described with reference to more specific examples below.

Preparation of Plate-Like Graphite Powders:

A polyimide film having a thickness of 25 μm was heated at 2600° C. for 4 hours in an argon gas atmosphere to prepare a graphite film having a thickness of about 17 μm, which was then pulverized into particles with a pin mill. Plate-like graphite powders 1 to 4 having different particle sizes were prepared by changing a rotational speed for pulverization and the amount of time during which pulverization was performed. Specifically, the plate-like graphite powder 4 having a large particle size was prepared by performing pulverization with a low rotational speed for a short period of time. Subsequently, the plate-like graphite powder 3 was prepared by increasing the rotational speed and the amount of time during which pulverization was performed. The rotational speed was further increased and pulverization was performed for a longer period of time than in the preparation of the plate-like graphite powder 3 to prepare the plate-like graphite particles 2. The rotational speed was still further increased and pulverization was performed for a still longer period of time than in the preparation of the plate-like graphite powder 2 to prepare the plate-like graphite powder 1.

<Particle Size Distributions of Plate-Like Graphite Powders>

The particle size distribution of each of the plate-like graphite powders 1 to 4 was measured with a laser diffraction-scattering particle size distribution analyzer LS230 (produced by Beckman Coulter). In the measurement of particle size distribution, a dry powder module was used, and the dry powder concentration was adjusted to be 3% to 5% by controlling the vibrator and the auger. The time duration for the measurement was set to 60 seconds. The Fraunhofer optical model was selected. The frequency of particle size on an area basis (surface area frequency) was calculated. FIG. 1 illustrates the particle size distribution of each of the plate-like graphite powders 1 to 4 determined in the above-described manner.

Inspection of the plate-like graphite powders 1 to 4 with an electron microscope revealed that the plate-like graphite powder 1 most frequently included scaly particles having a size of about 35 μm, the plate-like graphite powder 2 most frequently included scaly particles having a size of about 80 μm and frequently included scaly particles having a size of about 300 μm or less, scaly particles having a size of about 300 to 400 μm were most frequent in the plate-like graphite powder 3, and scaly particles having a size of about 100 to 400 μm were most frequent and a certain amount of relatively large particles having a size of 800 μm or more were also observed in the plate-like graphite powder 4.

<Specific Surface Areas of Plate-Like Graphite Powders>

The specific surface area of particles of each of the plate-like graphite powders 1 to 4 was measured by a BET multi-point method with an automatic specific surface area analyzer "Gemini" (produced by Shimadzu Corporation). The specific surface areas of particles of the plate-like graphite powders 1 to 4 were 2.33 m²/g, 1.27 m²/g, 0.91 m²/g, and 0.83 m²/g, respectively.

<Aspect Ratios of Plate-Like Graphite Powders>

Inspection of the shape of particles of each of the plate-like graphite powders 1 to 4 with an electron microscope revealed that plate-like particles whose longer axis had a length of 35 to 400 μm were most frequently included in any of the plate-like graphite powder 1 to 4. Since particles of these plate-like graphite powders had a thickness of about 17 μm, they had an aspect ratio of about 2 to 24.

Preparation of Oriented-Graphite Thermally Conductive Layers:

The oriented-graphite thermally conductive layers 1 to 4 described below were prepared.

<Oriented-Graphite Thermally Conductive Layer 1>

With an addition-reaction silicone that was a mixture (specific gravity: 1.0) of alkenyl-group-containing polyorganosiloxane (base agent) and organohydrogenpolysiloxane (curing agent), which served as a liquid polymer composition, the plate-like graphite powder 2 (specific gravity: 2.2), the plate-like graphite powder 3 (specific gravity: 2.2), a thermally conductive filler 1 composed of spherical aluminum oxide particles (specific gravity: 4.0) having a size of 3 μm and an aspect ratio of substantially 1, and a thermally conductive filler 2 composed of spherical aluminum oxide particles (specific gravity: 4.0) having a size of 10 μm and an aspect ratio of substantially 1 were mixed at the specific proportions shown in Table 1 (the proportions are expressed in parts by mass). The resulting mixture was stirred in order to form a uniform composition and then degassed. Hereby, a mixed composition used for forming an oriented-graphite thermally conductive layer 1 was prepared. The plate-like graphite powders and the thermally conductive fillers were subjected to a surface treatment with a silane coupling agent before used.

The mixed composition was formed into a sheet-like shape with a metal mold. The metal mold containing the mixed composition was left to stand for 10 minutes in a magnetic field of 8 tesla generated with a superconducting magnet such that the lines of magnetic force were oriented in the thickness direction of the sheet. The mixed composition was subsequently heated at 120° C. for 30 minutes to form an oriented-graphite thermally conductive layer 1. As oriented-graphite thermally conductive layers 1, specimens having thicknesses of 2.0 mm and 10.0 mm were prepared.

The average particle sizes of the thermally conductive fillers are the volume-average particle sizes of the thermally conductive fillers which were each determined on the basis of the particle size distribution of the filler measured by a laser diffraction-scattering method (JIS R1629). The aspect ratio of particles of each of the thermally conductive fillers was determined by observing the particles of the thermally conductive filler with an electron microscope. Particles of the thermally conductive fillers 1 and 2 and particles of the thermally conductive filler 3 described below had an aspect ratio of substantially 1.0.

<Oriented-Graphite Thermally Conductive Layers 2 to 4>

Oriented-Graphite thermally conductive Layers 2 to 4 were each prepared as in the preparation of the oriented-graphite thermally conductive layer 1, except that the proportions of the components of the mixed composition used for producing the oriented-graphite thermally conductive layer 1 were changed. Table 1 shows the proportions (in parts by mass) of the components of each of the mixed compositions used for producing the oriented-graphite thermally conductive layers 2 to 4. Each of the oriented-graphite thermally conductive layers 2 to 4 was also prepared in the form of a specimen having a thickness of 2.0 mm and in the form of a specimen having a thickness of 10.0 mm.

TABLE 1

|  |  | Oriented-graphite thermally conductive layer 1 | Oriented-graphite thermally conductive layer 2 | Oriented-graphite thermally conductive layer 3 | Oriented-graphite thermally conductive layer 4 |
|---|---|---|---|---|---|
| Composition | Plate-like graphite powder 1 | — | — | — | — |
|  | Plate-like graphite powder 2 | 30 | 30 | 30 | 30 |
|  | Plate-like graphite powder 3 | 60 | 60 | 60 | 60 |
|  | Plate-like graphite powder 4 | — | — | — | — |
|  | Thermally conductive filler 1 | 250 | 250 | 250 | 250 |
|  | Thermally conductive filler 2 | 200 | — | 200 | 200 |
|  | Insulating thermally conductive filler 3 | — | — | — | — |
|  | Base agent | 90 | 90 | 80 | 80 |
|  | Curing agent | 10 | 10 | 20 | 20 |
|  | Plasticizer | — | — | — | — |

Preparation of Insulating Thermally Conductive Layers:

The insulating thermally conductive layers 1 to 8 described below were prepared.

<Insulating Thermally Conductive Layer 1>

With an addition-reaction silicone (base agent and curing agent) that is the same as that used for preparing the oriented-graphite thermally conductive layer 1, which served as a liquid polymer composition, an insulating thermally conductive filler composed of spherical aluminum oxide particles (specific gravity: 4.0) having a size of 3 μm and an aspect ratio of substantially 1 which are the same as those used as the thermally conductive filler 1 and an insulating thermally conductive filler 3 composed of spherical aluminum oxide particles (specific gravity: 4.0) having a size of 40 μm and an aspect ratio of substantially 1 were mixed at the specific proportions shown in Table 2 (the proportions are shown in parts by mass). The resulting mixture was stirred and then degassed. Hereby, a mixed composition used for forming an insulating thermally conductive layer 1 was prepared. The insulating thermally conductive fillers were also subjected to a surface treatment with a silane coupling agent before used. The mixed composition was formed into a sheet-like shape with a metal mold and subsequently heated at 120° C. for 30 minutes to form an insulating thermally conductive layer 1. The insulating thermally conductive layer 1 was prepared in the form of specimens having a thicknesses of 0.10, 0.15, 0.25, 0.50, 0.75, and 10.0 mm.

<Insulating Thermally Conductive Layer 2 to 8>

Insulating thermally conductive layers 2 to 8 were each prepared as in the preparation of the insulating thermally conductive layer 1, except that the composition of the mixed composition used for producing the insulating thermally conductive layer 1 was changed to the specific one of the compositions (parts by mass) shown in Table 2. The plasticizer added to the insulating thermally conductive layers 4 and 5 was dimethylpolysiloxane (silicone oil, viscosity: 100 mPa·s).

The insulating thermally conductive layers 2 to 8 were each prepared in the form of specimens having thicknesses of 0.5 and 10.0 mm, except that only the insulating thermally conductive layer 6 was prepared also in the form of specimens having thicknesses of 0.25 and 0.75 mm.

integrate the oriented-graphite thermally conductive layer with the insulating thermally conductive layer by only directly stacking them on top of each other without the risk of the oriented-graphite thermally conductive layer detaching from the insulating thermally conductive layer.

TABLE 2

|  |  | Insulating thermally conductive layer 1 | Insulating thermally conductive layer 2 | Insulating thermally conductive layer 3 | Insulating thermally conductive layer 4 | Insulating thermally conductive layer 5 | Insulating thermally conductive layer 6 | Insulating thermally conductive layer 7 | Insulating thermally conductive layer 8 |
|---|---|---|---|---|---|---|---|---|---|
| Composition | Plate-like graphite powder 1 | — | — | — | — | — | — | — | — |
|  | Plate-like graphite powder 2 | — | — | — | — | — | — | — | — |
|  | Plate-like graphite powder 3 | — | — | — | — | — | — | — | — |
|  | Plate-like graphite powder 4 | — | — | — | — | — | — | — | — |
|  | Thermally conductive filler 1 | 520 | 520 | 520 | 560 | 560 | 240 | 320 | 520 |
|  | Thermally conductive filler 2 | — | — | — | — | — | — | — | — |
|  | Insulating thermally conductive filler 3 | 780 | 780 | 780 | 840 | 840 | 360 | 480 | 780 |
|  | Base agent | 90 | 82 | 80 | 64 | 66 | 88 | 85 | 95 |
|  | Curing agent | 10 | 18 | 20 | 6 | 4 | 12 | 15 | 5 |
|  | Plasticizer | — | — | — | 30 | 30 | — | — | — |

Preparation of Thermally Conductive Sheets:

The thermally conductive sheets 1 to 21 described below were prepared.

<Thermally Conductive Sheets 1 to 19>

Thermally conductive sheets 1 to 19 were each prepared by stacking, on top of each other, the specific oriented-graphite thermally conductive layer selected from the oriented-graphite thermally conductive layers 1 to 4 prepared above and the specific insulating thermally conductive layer selected from the insulating thermally conductive layers 1 to 8 prepared above as shown in Tables 3 to 5.

Since the oriented-graphite thermally conductive layers 1 to 4 and the insulating thermally conductive layers 1 to 8 all had slightly adhesive surfaces, it was possible to readily <Thermally Conductive Sheet 20>

The oriented-graphite thermally conductive layer 1 on which any insulating thermally conductive layer was not formed was used as a thermally conductive sheet 20.

<Thermally Conductive Sheet 21>

A thermally conductive sheet 21 was prepared by stacking a polyimide film (thermal conductivity: 0.16 W/m·K, thickness: 50 μm), in comparison with the insulating thermally conductive layers, on the oriented-graphite thermally conductive layer 1.

TABLE 3

|  | Thermally conductive sheet 1 | Thermally conductive sheet 2 | Thermally conductive sheet 3 | Thermally conductive sheet 4 | Thermally conductive sheet 5 | Thermally conductive sheet 6 | Thermally conductive sheet 7 | Thermally conductive sheet 8 |
|---|---|---|---|---|---|---|---|---|
| Oriented-graphite thermally conductive layer No. | 1 | 1 | 1 | 1 | 1 | 1 | 3 | 4 |
| Thickness (mm) | 2 | 2 | 2 | 2 | 2 | 2 | 2 | 2 |
| E-hardness (equivalent) | 13 | 13 | 13 | 13 | 13 | 13 | 63 | 75 |
| OO-hardness | 40 | 40 | 40 | 40 | 40 | 40 | 80 | 90 |
| Penetration (μm) | 147 | 147 | 147 | 147 | 147 | 147 | 14.7 | 7.2 |
| Thermal conductivity (W/m · k) | 14.1 | 14.1 | 14.1 | 14.1 | 14.1 | 14.1 | 14.1 | 14.1 |
| Insulating thermally conductive layer No. | 1 | 8 | 2 | 3 | 5 | 4 | 2 | 3 |
| Thickness (mm) | 0.5 | 0.5 | 0.5 | 0.5 | 0.5 | 0.5 | 0.5 | 0.5 |
| E-hardness | 40 | 10 | 70 | 80 | 18 | 25 | 70 | 80 |
| OO-hardness (equivalent) | 62 | 38 | 86 | 94 | 44 | 50 | 86 | 94 |
| Penetration (μm) | 12.3 | 69.9 | 6.1 | 5.1 | 33.4 | 22.1 | 5.9 | 5.1 |
| Thermal conductivity (W/m · k) | 5.0 | 5.0 | 5.0 | 5.0 | 6.0 | 6.0 | 5.0 | 5.0 |
| Evaluations Thermal conductivity (W/m · k) | 13.4 | 14.0 | 12.9 | 11.5 | 13.9 | 13.1 | 10.9 | 10.6 |
| Reduction in thermal conductivity (%) | 5.0 | 0.7 | 8.5 | 18.4 | 1.4 | 7.1 | 22.7 | 24.8 |
|  | ○ | ○ | ○ | △ | ○ | ○ | △ | △ |
| Dielectric breakdown voltage (kV/mm) | >5 | 0 | >5 | >5 | 4.0 | >5 | >5 | >5 |
|  | ○ | X | ○ | ○ | ○ | ○ | ○ | ○ |
| Consistency in insulating property | ○ | ○ | ○ | ○ | X | ○ | ○ | ○ |
| Ease of handling | ○/○ | ○/○ | ○/△ | ○/X | ○/○ | ○/○ | ○/○ | X/X |
| Overall | ◎ | X | ○ | △ | △ | ◎ | ◎ | △ |

TABLE 4

|  | Thermally conductive sheet 9 | Thermally conductive sheet 10 | Thermally conductive sheet 11 | Thermally conductive sheet 12 | Thermally conductive sheet 13 | Thermally conductive sheet 14 | Thermally conductive sheet 15 |
|---|---|---|---|---|---|---|---|
| Oriented-graphite thermally conductive layer No. | 1 | 1 | 2 | 2 | 2 | 1 | 1 |
| Thickness (mm) | 2 | 2 | 2 | 2 | 2 | 2 | 2 |
| E-hardness (equivalent) | 13 | 13 | 13 | 13 | 13 | 13 | 13 |
| OO-hardness | 40 | 40 | 40 | 40 | 40 | 40 | 40 |
| Penetration (μm) | 147 | 147 | 147 | 147 | 147 | 147 | 147 |
| Thermal conductivity (W/m · k) | 14.1 | 14.1 | 11.4 | 11.4 | 11.4 | 14.1 | 14.1 |
| Insulating thermally conductive layer No. | 6 | 7 | 6 | 7 | 1 | 1 | 1 |
| Thickness (mm) | 0.5 | 0.5 | 0.5 | 0.5 | 0.5 | 0.1 | 0.15 |
| E-hardness | 20 | 40 | 20 | 40 | 40 | 40 | 40 |
| OO-hardness (equivalent) | 46 | 62 | 46 | 62 | 62 | 62 | 62 |
| Penetration (μm) | 29.3 | 12.3 | 29.3 | 12.3 | 12.3 | 6.4 | 7.2 |
| Thermal conductivity (W/m · k) | 1.5 | 2.5 | 1.5 | 2.5 | 5.0 | 5.0 | 5.0 |
| Evaluations Thermal conductivity (W/m · k) | 9.0 | 10.1 | 7.8 | 8.4 | 10.5 | 13.9 | 13.9 |
| Reduction in thermal conductivity (%) | 36.2 | 28.4 | 31.6 | 26.3 | 7.9 | 1.4 | 1.4 |
|  | X | Δ | X | Δ | ○ | ○ | ○ |
| Dielectric breakdown voltage (kV/mm) | >5 | >5 | >5 | >5 | >5 | 1.5 | 3.0 |
|  | ○ | ○ | ○ | ○ | ○ | X | ○ |
| Consistency in insulating property | ○ | ○ | ○ | ○ | ○ | ○ | ○ |
| Ease of handling | ○/○ | ○/○ | ○/○ | ○/○ | ○/○ | ○/○ | ○/○ |
| Overall | Δ | ○ | Δ | ○ | ◎ | X | ◎ |

TABLE 5

|  | Thermally conductive sheet 16 | Thermally conductive sheet 17 | Thermally conductive sheet 18 | Thermally conductive sheet 19 | Thermally conductive sheet 20 | Thermally conductive sheet 21 |
|---|---|---|---|---|---|---|
| Oriented-graphite thermally conductive layer No. | 1 | 1 | 1 | 1 | 1 | 1 |
| Thickness (mm) | 2 | 2 | 2 | 2 | 2 | 2 |
| E-hardness (equivalent) | 13 | 13 | 13 | 13 | 13 | 13 |
| OO-hardness | 40 | 40 | 40 | 40 | 40 | 40 |
| Penetration (μm) | 147 | 147 | 147 | 147 | 147 | 147 |
| Thermal conductivity (W/m · k) | 14.1 | 14.1 | 14.1 | 14.1 | 14.1 | 14.1 |
| Insulating thermally conductive layer No. | 6 | 6 | 1 | 1 | None | Polyimide |
| Thickness (mm) | 0.25 | 0.75 | 0.25 | 0.75 | — | 0.050 |
| E-hardness | 20 | 20 | 40 | 40 | — | — |
| OO-hardness (equivalent) | 46 | 46 | 62 | 62 | — | — |
| Penetration (μm) | 23.1 | 51.4 | 8.6 | 20.9 | — | 0 |
| Thermal conductivity (W/m · k) | 1.5 | 1.5 | 5.0 | 5.0 | — | 0.16 |
| Evaluations Thermal conductivity (W/m · k) | 10.9 | 8.4 | 13.9 | 13.3 | 14.1 | 7.4 |
| Reduction in thermal conductivity (%) | 22.7 | 40.4 | 1.4 | 5.7 | — | 47.5 |
|  | Δ | X | ○ | ○ | — | X |
| Dielectric breakdown voltage (kV/mm) | >5 | >5 | >5 | >5 | 0 | >5 |
|  | ○ | ○ | ○ | ○ | X | ○ |
| Consistency in insulating property | ○ | ○ | ○ | ○ | ○ | ○ |
| Ease of handling | ○/○ | ○/○ | ○/○ | ○/○ | ○/○ | ○/X |
| Overall | ○ | Δ | ◎ | ◎ | X | X |

Tests of Properties:

<Measurement of Hardness>

The hardness of each of the oriented-graphite thermally conductive layers 1 to 4 was determined by measuring the OO-hardness of the corresponding specimen having a thickness of 10.0 mm with a Type-OO durometer. Tables 3 to 5 show the results. The hardness of each of the insulating thermally conductive layers 1 to 8 was determined by measuring the E-hardness of the corresponding specimen having a thickness of 10.0 mm with a Type-E durometer. Tables 3 to 5 show the results (note: although the thicknesses of the oriented-graphite thermally conductive layers and the insulating thermally conductive layers shown in Tables 3 to 5 are not 10.0 mm, the hardness values of the specimens having a thickness of 10.0 mm are shown in Tables 3 to 5 because OO-hardness and E-hardness are principally independent of thickness).

Measurement of the E-hardness values of the specimens having an OO-hardness of 40 to 90 confirmed a correlation between the OO-hardness values and the E-hardness values of the specimens. Thus, the following approximation formula was obtained.

($E$-hardness)=1.25×($OO$-hardness)−37.4

Tables 3 to 5 also show the E-hardness of each of the oriented-graphite thermally conductive layers which was calculated from the OO-hardness thereof by the approximation formula and the OO-hardness of each of the insulating thermally conductive layers which was calculated from the E-hardness thereof by the approximation formula.

<Measurement of Penetration>

The penetration of each of the oriented-graphite thermally conductive layers and the insulating thermally conductive layers was also measured as an index of hardness other than the above hardness indices. Specifically, each of the specimens was cut into a 10-mm-long, 10-mm-wide shape and then placed in a thermomechanical analyzer (TMA-50, produced by Shimadzu Corporation) with a penetration probe having a 0.5-mm diameter cylindrical protrusion.

Subsequently, the depth of penetration of the probe which occurred while a load was applied to the specimen at 23° C. for 3 minutes at a loading rate of 1 g/min with a target load of 0.5 g (i.e., the load was increased from 0 to 0.5 g in the initial 30 seconds and kept constant at 0.5 g from 30 seconds to 3 minutes) was measured. Tables 3 to 5 show the results.

Figure 2:
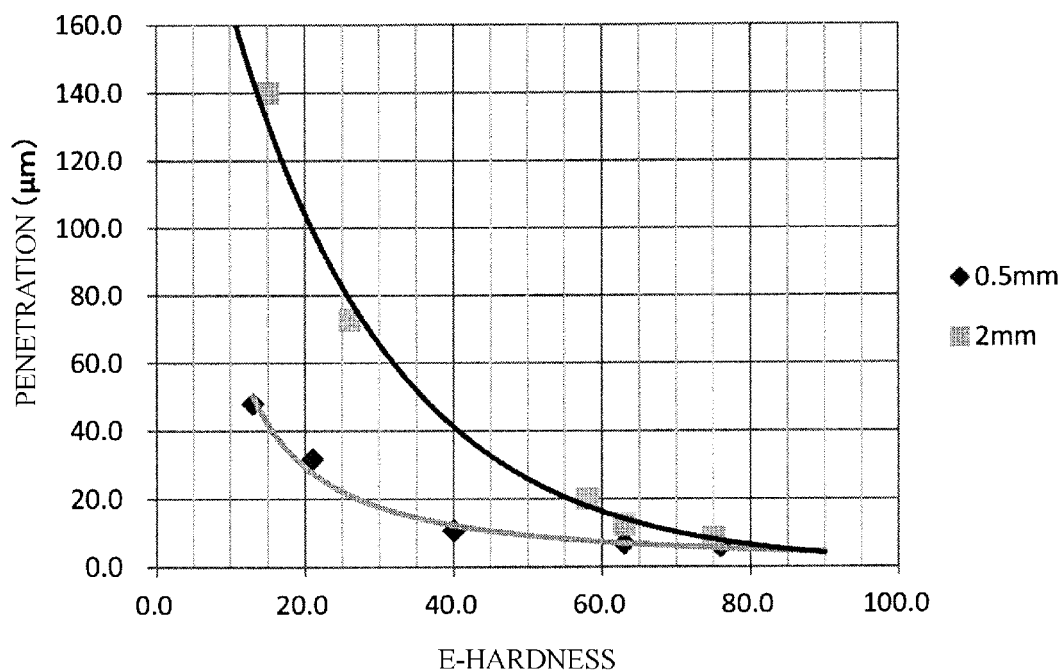
FIG. 2 includes graphs illustrating the relationships between penetration and E-hardness.

FIG. 2 illustrates comparisons between the penetration of a specimen selected from the above specimens and the E-hardness (or E-hardness calculated from the OO-hardness) of a specimen having the same composition as the specimen and a thickness of 10.0 mm. Specifically, the penetration values of the specimens having thicknesses of 2 and 0.5 mm were each plotted against the E-hardness of a specimen having the same composition as the specimen and having a thickness of 10.0 mm on a graph, and the relationship (each of the two curves illustrated in FIG. 2) between penetration and E-hardness was determined from the graph for each thickness.

As illustrated in FIG. 2, the penetration of a specimen varied with the thickness of the specimen. When the above relationship has been determined, it is possible to estimate the E-hardness of a specimen having a certain thickness by measuring the penetration of the specimen. That is, the E-hardness of a specimen having a thickness of 2 or 0.5 mm can be determined by substituting the penetration of the specimen into the corresponding one of the relationships illustrated in FIG. 2. It is also possible to determine the E-hardness of a specimen having a thickness other than 2 or 0.5 mm by preparing the relationship between the penetration and the E-hardness of the specimen having a specific length as in the preparation of the above relationships and by substituting the penetration of the specimen into the relationship.

The penetration of the thermally conductive sheet that includes the oriented-graphite thermally conductive layer and the insulating thermally conductive layer stacked thereon falls between the penetration of a specimen composed only of the oriented-graphite thermally conductive layer and having the same thickness as the thermally conductive sheet and the penetration of a specimen composed of only of the insulating thermally conductive layer and having the same thickness as the thermally conductive sheet.

The penetration of the thermally conductive sheet also varies depending on whether it is determined on the side of the thermally conductive sheet on which the oriented-graphite thermally conductive layer is located or on the side on which the insulating thermally conductive layer is located. When the insulating thermally conductive layer has a higher hardness than the oriented-graphite thermally conductive layer, the penetration of the thermally conductive sheet determined on the side on which the insulating thermally conductive layer is located is smaller (harder).

The above findings can be summarized as follows. In the case where the penetration values of a specimen having a thickness of L mm which are measured on the front and rear sides of the specimen are A and B μm, respectively, and A>B, the front surface-side layer of the specimen is considered to have an E-hardness lower than that calculated from the penetration of the specimen having a thickness of L mm on the basis of the graph illustrated in FIG. 2, and the rear surface-side layer is considered to have an E-hardness higher than that calculated from the penetration of the specimen having a thickness of L mm on the basis of the graph illustrated in FIG. 2.

<Measurement of Heat resistance and Calculation of Thermal Conductivity>

Each of the specimens was cut into a 10-mm long 10-mm wide size and interposed between a heat-generating substrate (amount of heat generation Q: 25 W) and a heat sink ("FH60-30" produced by Alpha Company Ltd.). A certain amount of load (2 kgf/cm$^2$) was applied to the heat sink. The heat sink was provided with a cooling fan (air flow rate: 0.01 kg/sec, air pressure: 49 Pa) attached to the upper portion of the heat sink. A temperature sensor was connected to the heat sink and the heat-generating substrate. While the cooling fan was driven, a current was applied to the heat-generating substrate. After the lapse of 5 minutes since the application of the current was started, the temperature (T1) of the heat-generating substrate and the temperature (T2) of the heat sink were measured. The heat resistance of each of the specimens was calculated by substituting these temperatures into the Formula (2) below.

Heat resistance (° C./W)=(T1−T2)/Amount of heat generated Q        Formula (2)

The heat resistance of each specimen was converted into thermal conductivity by Formula (3) below.

Heat resistance (° C./W)=Thickness of specimen in the direction in which heat passed (m)/(Cross-sectional area of the specimen through which heat passed (m$^2$)×Thermal conductivity (W/m·K))         Formula (3)

Tables 3 to 5 show the thermal conductivity of each specimen.

<Measurement of Dielectric Breakdown Voltage>

The dielectric breakdown voltage of each of the thermally conductive sheets which serves as an index of insulating property was measured. When a specimen is interposed between two electrodes and a voltage applied between the electrodes is gradually increased while a 200 g load is applied to the multilayer body, the amount of current that passes through the multilayer body suddenly starts increasing and the specimen becomes electrically conductive as a result of a portion of the specimen becoming molten to form a hole or carbonized. The amount of voltage at which the above phenomenon occurs is referred to as dielectric breakdown voltage. Specifically, the dielectric breakdown voltage of each of the thermally conductive sheets was determined with a withstanding voltage tester (TOS8650, produced by KIKUSUI ELECTRONICS CORPORATION) in accordance with JIS K6249. For each of the thermally conductive sheets, five specimens were prepared and the above test was conducted five times. Tables 3 to 5 show the average dielectric breakdown voltage of each thermally conductive sheet measured in the five tests.

<Adhesiveness Test>

The adhesiveness of the surface of each of the thermally conductive sheets was determined. Each of the thermally conductive sheets was cut into a 10-mm long 10-mm wide specimen, which was placed on a stainless steel sheet arranged horizontally. Subsequently, a 200-gram weight was placed on the specimen for 10 seconds with a peeling film interposed between the weight and the specimen such that the thermally conductive sheet was pressed against the stainless steel sheet. Then, whether or not the specimen detaches and drops from the stainless steel sheet within 10 seconds after the stainless steel sheet was turned upside down was determined. The stainless steel sheet used was a stainless steel sheet prepared with a 2B surface finish. The above test was conducted in each of the case where, when the thermally conductive sheet was placed on the stainless steel sheet, the thermally conductive sheet was brought into contact with the stainless steel sheet on the side on which the oriented-graphite thermally conductive layer was located and the case where the thermally conductive sheet was brought into contact with the stainless steel sheet on the side on which the insulating thermally conductive layer was located. Tables 3 to 5 show the evaluation results in the order of the oriented-graphite thermally conductive layer-side and the insulating thermally conductive layer-side.

Evaluations of Properties:

<Hardness>

A comparison between the thermally conductive sheets 1 to 6, which each included an oriented-graphite thermally conductive layer having an OO-hardness of 40 and an insulating thermally conductive layer having a different hardness, confirms the following. The thermally conductive sheet 2, which included an insulating thermally conductive layer having the lowest hardness, that is, an E-hardness of 10, had the highest thermal conductivity but a dielectric breakdown voltage of 0 kV/mm. That is, the thermally conductive sheet 2 did not have the desired insulating property. The thermally conductive sheet 5, which included an insulating thermally conductive layer having an E-hardness of 18, had an average dielectric breakdown voltage of 4 kV/mm, but a dielectric breakdown voltage of 0 kV/mm was measured only once in the five measurements. In contrast, the thermally conductive sheets 1 and 3 to 6, which included an insulating thermally conductive layer having an E-hardness of 25, 40, 70, and 80, respectively, all had a dielectric breakdown voltage exceeding 5 kV/mm. The above results confirm that, the higher the flexibility of the insulating thermally conductive layer, the higher the thermal conductivity of the thermally conductive sheet.

A comparison between the thermally conductive sheets 7 and 8, which each included an oriented-graphite thermally conductive layer having an OO-hardness of 80 or 90, respectively, and insulating thermally conductive layers having different hardness values, confirms that the thermally conductive sheets 7 and 8 had a dielectric breakdown voltage exceeding 5 kV/mm and the thermally conductive sheet 8 had a slightly lower thermal conductivity.

The thermally conductive sheet 2, which did not have the desired dielectric breakdown voltage, included an insulating thermally conductive layer having a lower hardness than an oriented-graphite thermally conductive layer. Inspection of the specimen interposed and compressed between electrodes confirmed that the insulating thermally conductive layer extended off the periphery of the specimen. This confirms that, if the insulating thermally conductive layer has a lower hardness than the oriented-graphite thermally conductive layer, the insulating thermally conductive layer becomes excessively compressed when the thermally conductive sheet is compressed and, consequently, the insulating property of the thermally conductive sheet becomes degraded.

It is considered that the dielectric breakdown voltage of the thermally conductive sheet 5 was 0 kV/mm once in N=5 because the insulating property of the thermally conductive sheet became degraded as a result of cracks or the like being formed in the insulating thermally conductive layer when the sheet was compressed. Although the insulating thermally conductive layer had a slightly higher hardness than the oriented-graphite thermally conductive layer, the E-hardness of the insulating thermally conductive layer was only 18, which was considerably low. Thus, it is considered that the insulating thermally conductive layer was poor in strength and brittle.

Since the thermally conductive sheet 8, which included an oriented-graphite thermally conductive layer having an OO-hardness of 90, and the thermally conductive sheet 4, which included an insulating thermally conductive layer having an E-hardness of 80, had a relatively low thermal conductivity, it is considered that the OO-hardness of the oriented-graphite thermally conductive layer is preferably 80 or less and the E-hardness of the insulating thermally conductive layer is preferably 70 or less.

<Thermal Conductivity>

A comparison was made between the thermally conductive sheets 1 and 9 to 13, which each included a different combination of an oriented-graphite thermally conductive layer having a specific thermal conductivity and an insulating thermally conductive layer having a specific thermal conductivity. The thermally conductive sheets 1, 9, and 10 are thermally conductive sheets that included an oriented-graphite thermally conductive layer having a thermal conductivity of 14.1 W/m·K and an insulating thermally conductive layer having a thermal conductivity of 5.0 W/m·K, 1.5 W/m·K, or 2.5 W/m·K, respectively, stacked thereon. The thermally conductive sheet 1, which included an insulating thermally conductive layer having a thermal conductivity of 5.0 W/m·K, had a high thermal conductivity. In addition, the reduction in thermal conductivity that occurred as a result of stacking the insulating thermally conductive layer on the oriented-graphite thermally conductive layer was small. Consequently, the thermally conductive sheet 1 had a thermal conductivity considerably close to that of the oriented-graphite thermally conductive layer. The same was confirmed by the comparison between the thermally conductive sheets 11 to 13, which each included an oriented-graphite thermally conductive layer having a thermal conductivity of 11.4 W/m·K and an insulating thermally conductive layer having a thermal conductivity of 1.5 W/m·K, 2.5 W/m·K, or 5.0 W/m·K, respectively, stacked thereon.

<Thickness of Insulating Thermally Conductive Layer>

The thermally conductive sheets 14 and 15 each included an insulating thermally conductive layer having a thickness of 0.10 mm or 0.15 mm, respectively. While the thermally conductive sheet 15 including an insulating thermally conductive layer having a thickness of 0.15 mm had a dielectric breakdown voltage of 3.0 kV/mm, the dielectric breakdown voltage of the thermally conductive sheet 14 including an insulating thermally conductive layer having a thickness of 0.10 mm was reduced to 1.5 kV/mm. This confirms that the thickness of the insulating thermally conductive layer is preferably 0.15 mm or more.

<Relationship Between Thermal Conductivity and Thickness of Insulating Thermally Conductive Layer>

The thermally conductive sheets 16 to 19 and the thermally conductive sheets 1 and 9 are thermally conductive sheets that each included an oriented-graphite thermally conductive layer having a thermal conductivity of 14.1 W/m·K and a thickness of 2 mm and an insulating thermally conductive layer having a thermal conductivity of 1.5 or 5.0 W/m·K and a thickness of 0.25, 0.50, or 0.75 mm stacked thereon.

Figure 3:
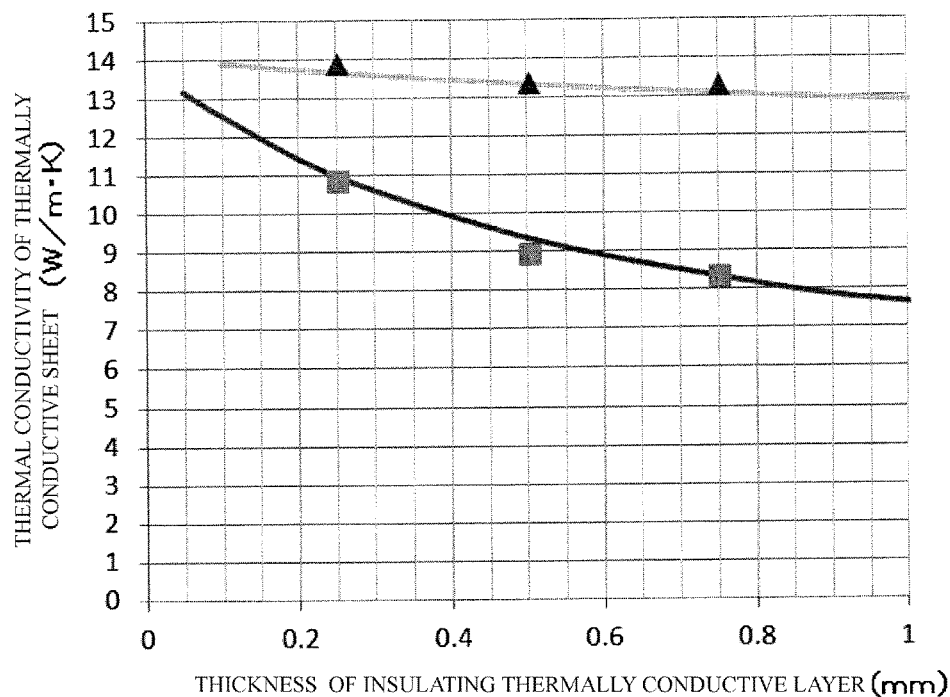
FIG. 3 includes graphs illustrating the relationships between the thermal conductivity of a thermally conductive sheet and the thickness of an insulating thermally conductive layer.

FIG. 3 illustrates the graphs prepared by plotting the thermal conductivity of the thermally conductive sheet in the y-axis against the thickness of the insulating thermally conductive layer in the x-axis.

The "(1) thickness of the insulating thermally conductive layer having a thermal conductivity of 1.5 W/m·K at which the thermal conductivity of the thermally conductive sheet reaches 13.0 W/m·K" and "(2) thickness of the insulating thermally conductive layer having a thermal conductivity of 5.0 W/m·K at which the thermal conductivity of the thermally conductive sheet reaches 13.0 W/m·K" determined from the graphs illustrated in FIG. 3 were 0.06 mm and 0.82 mm, respectively.

Figure 4:
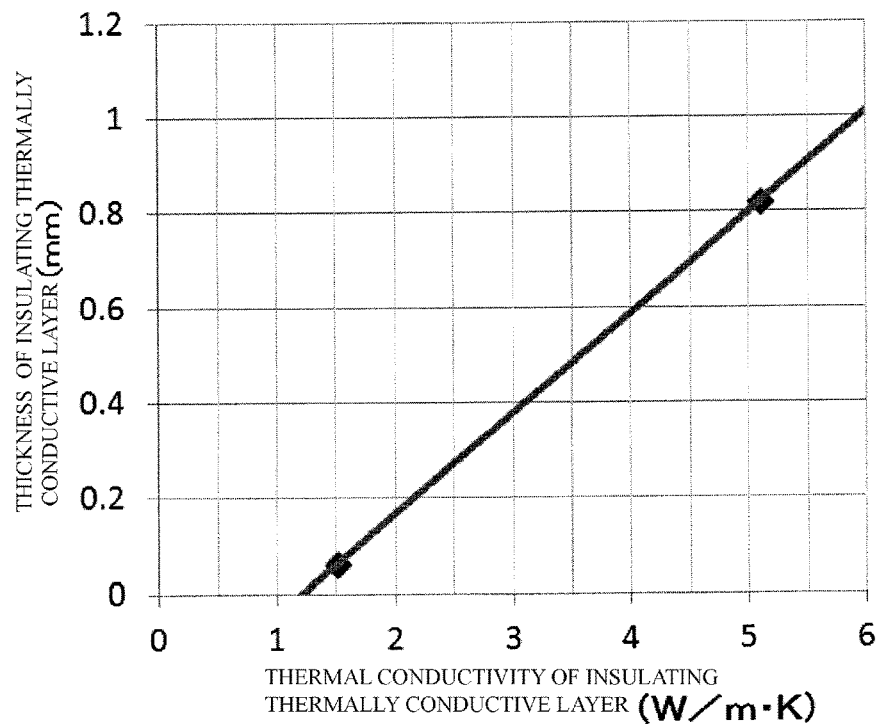
FIG. 4 is a graph illustrating the correlation between the thickness and thermal conductivity of an insulating thermally conductive layer.

FIG. 4 illustrates a graph prepared by plotting the thickness of each of the above insulating thermally conductive layers at which the thermal conductivity of the thermally conductive sheet reaches 13.0 W/m·K in the y-axis against the thermal conductivity of the insulating thermally conductive layer in the x-axis.

An approximation formula y=0.21x−0.26 was derived from the graph illustrated in FIG. 4.

Then, Formula (1) below that represents the relationship between the thermal conductivity W(x) (unit: W/m·K) and thickness T(y) (unit: mm) of the insulating thermally conductive layer required for producing a thermally conductive sheet having a thermal conductivity of 13.0 W/m·K or more was derived from the above formula.

$$0 < T \leq 0.21\ W - 0.26 \quad \text{Formula (1)}$$

<Dielectric Breakdown Voltage>

Each of the thermally conductive sheets was evaluated in terms of dielectric breakdown voltage as "◯" when the dielectric breakdown voltage of the thermally conductive sheet was 3 kV/mm or more and as "x" when the dielectric breakdown voltage of the thermally conductive sheet was less than 3 kV/mm. Tables 3 to 5 show the results.

<Consistency in Insulating Property>

The degree of fluctuations in the dielectric breakdown voltage of each of the thermally conductive sheets in the measurement of dielectric breakdown voltage was evaluated. Specifically, an evaluation grade of "x" was given when the average dielectric breakdown voltage of the thermally conductive sheet exceeded 3 kV/mm but the dielectric breakdown voltage of the thermally conductive sheet was 0 kV/mm once or more in the five measurements. Otherwise, an evaluation grade of "◯" was given.

<Reduction in Thermal Conductivity>

A reduction in thermal conductivity that occurred when an insulating thermally conductive layer having a lower thermal conductivity than an oriented-graphite thermally conductive layer having a high thermal conductivity was stacked on the oriented-graphite thermally conductive layer was evaluated. Specifically, the difference in thermal conductivity between the oriented-graphite thermally conductive layer and the thermally conductive sheet divided by the thermal conductivity of the oriented-graphite thermally conductive layer as shown in Formula (4) below was defined and calculated as a reduction in the thermal conductivity of the thermally conductive sheet relative to that of the oriented-graphite thermally conductive layer (hereinafter, referred to simply as "reduction in thermal conductivity").

Reduction in thermal conductivity=(Thermal conductivity of oriented-graphite thermally conductive layer−

Thermal conductivity of thermally conductive sheet)/Thermal conductivity of oriented-graphite thermally conductive layer  Formula (4)

Tables 3 to 5 show the reduction in the thermal conductivity of each of the thermally conductive sheets. When the reduction in the thermal conductivity of the thermally conductive sheet was less than 10%, it is considered that the thermal conductivity of the thermally conductive sheet was not reduced significantly compared with that of the oriented-graphite thermally conductive layer alone and the adverse impacts of stacking the insulating thermally conductive layer on the oriented-graphite thermally conductive layer were reduced. Thus, such a thermally conductive sheet was evaluated as "◯". When the reduction in the thermal conductivity of the thermally conductive sheet was 10% or more and less than 30%, it is considered that the adverse impacts of stacking the insulating thermally conductive layer on the oriented-graphite thermally conductive layer were slightly reduced. Thus, such a thermally conductive sheet was evaluated as "Δ". When the reduction in the thermal conductivity of the thermally conductive sheet was 30% or more, it is considered that the thermal conductivity of the thermally conductive sheet was reduced significantly compared with that of the oriented-graphite thermally conductive layer. Thus, such a thermally conductive sheet was evaluated as "x". Tables 3 to 5 also show the results.

<Ease of Handling (Adhesiveness)>

A thermally conductive sheet having an adhesive surface can be fixed to an adherend, which increases ease of mounting the thermally conductive sheet onto an electronic device. Accordingly, whether each of the thermally conductive sheets was capable of being fixed to an adherend was determined and evaluated in terms of ease of handling. Specifically, in the adhesiveness test described above, when the specimen of the thermally conductive sheet was detached and dropped from the stainless steel sheet within 10 seconds, the thermally conductive sheet was considered to be difficult to handle and evaluated as "x". Otherwise, when the specimen of the thermally conductive sheet was not dropped from the stainless steel sheet, the thermally conductive sheet was evaluated as "◯".

The results of the ease-of-handling test shown in Tables 3 to 5 confirm that the insulating thermally conductive layer-side surface of the thermally conductive sheet 3 was evaluated as "Δ" and slightly poor in terms of ease of handling and the insulating thermally conductive layer-side surface of the thermally conductive sheet 4 was evaluated as "x" and not capable of being fixed to an adherend. This proves that the E-hardness of the insulating thermally conductive layer is preferably 70 or less. The evaluation results of the ease-of-handling test of the thermally conductive sheets 7 and 8 confirm that the oriented-graphite thermally conductive layer-side surface of the thermally conductive sheet 7, which had an OO-hardness of 80, was evaluated as slightly poor in terms of ease of handling and the thermally conductive sheet 8 having an OO-hardness of 90 was not capable of being fixed to an adherend. This proves that the OO-hardness of the oriented-graphite thermally conductive layer is preferably 80 or less.

<Overall Evaluation of Thermal Conductivity and Insulating Property>

The overall evaluation of each of the thermally conductive sheets was made on the basis of the above evaluations made from various viewpoints. An overall evaluation grade of "x" was given to the thermally conductive sheets 2, 14, and 20, which did not have an insulating property (evaluated as "x" in terms of dielectric breakdown voltage), and the thermally conductive sheet 21, which was evaluated as "x" in terms of reduction in thermal conductivity and ease of handling, while an overall evaluation grade of "⊚" was given to thermally conductive sheets that were not evaluated as "x" in terms of any of the above evaluation items. An overall evaluation grade of "○" was given to thermally conductive sheets that were evaluated as "Δ" in terms of any of the above evaluation items. An overall evaluation grade of "Δ" was given to thermally conductive sheets that were evaluated as "x" in terms of any of the above evaluation items other than dielectric breakdown voltage. Tables 3 to 5 also show the results of the overall evaluation.

As described above, the thermally conductive sheets including an oriented-graphite thermally conductive layer and an insulating thermally conductive layer stacked thereon were not evaluated as poor in terms of two or more properties, in contrast to thermally conductive sheets including a resin film which were poor in terms of ease of handling and had a significantly high reduction in insulating property or thermal conductivity. Thermally conductive sheets having the predetermined hardness, the predetermined thickness, the predetermined thermal conductivity, and the like were also excellent in terms of ease of handling and thermal conductivity.

The invention claimed is:

1. A thermally conductive sheet comprising
an oriented-graphite thermally conductive layer and
an insulating thermally conductive layer stacked on the oriented-graphite thermally conductive layer,
the oriented-graphite thermally conductive layer including a polymer matrix including a plate-like graphite powder, flat surfaces of particles of the plate-like graphite powder being oriented in a thickness direction of the sheet,
an amount of plate-like graphite powder included in the oriented-graphite thermally conductive layer is 75 to 105 parts by mass relative to 100 parts by mass of the polymer matrix, and an amount of thermally conductive filler having an aspect ratio of 2 or less is 250 to 700 parts by mass relative to 100 parts by mass of the polymer matrix,
the insulating thermally conductive layer including a polymer matrix including an insulating thermally conductive filler,
the amount of the insulating thermally conductive filler is 300 to 2000 parts by mass relative to 100 parts by mass of the polymer matrix,
the insulating thermally conductive filler including particles at least one of aluminum oxide, magnesium oxide, zinc oxide, aluminum nitride, silicon carbide, and aluminum hydroxide, and
the insulating thermally conductive filler is dispersed in the polymer matrix,
the insulating thermally conductive layer having a thermal conductivity and an insulating property,
wherein the oriented-graphite thermally conductive layer has a Type-OO hardness of 10 to 80 as determined in accordance with ASTM D2240,
wherein the insulating thermally conductive layer is harder than the oriented-graphite thermally conductive layer and has a Type-E hardness of 70 or less as determined in accordance with ASTM D2240 and a thickness of 0.15 to 1.5 mm, and
wherein the thermal conductivity (W) (unit: W/m·K) and the thickness (T) (unit: mm) of the insulating thermally conductive layer satisfy a relationship represented by Formula (1), $$0 < T \leq 0.21\ W - 0.26 \qquad \text{Formula (1)}.$$

2. The thermally conductive sheet according to claim 1, wherein the polymer matrix is produced by curing a liquid silicone prepared using a base agent and a curing agent.

3. The thermally conductive sheet according to claim 1, wherein a thermal conductivity of the oriented-graphite thermally conductive layer in a thickness direction of the oriented-graphite thermally conductive layer is 7 W/m·K or more and 30 W/m·K or less, wherein a thermal conductivity of the insulating thermally conductive layer is 2 W/m·K or more and less than 7 W/m·K, and wherein the thermal conductivity of the oriented-graphite thermally conductive layer in the thickness direction is higher than the thermal conductivity of the insulating thermally conductive layer.

4. The thermally conductive sheet according to claim 1, wherein the insulating thermally conductive layer has a smaller thickness than the oriented-graphite thermally conductive layer.

5. The thermally conductive sheet according to claim 1, wherein the thermal conductivity of the insulating thermally conductive layer is 5 W/m·K or more.

6. The thermally conductive sheet according to claim 1, wherein the E-hardness of the insulating thermally conductive layer is 20 or more.

* * * * *